US012648163B2

(12) United States Patent
Miyoshi et al.

(10) Patent No.: US 12,648,163 B2
(45) Date of Patent: Jun. 2, 2026

(54) SEMICONDUCTOR DEVICE, POWER CONVERSION DEVICE USING SAME, AND MANUFACTURING METHOD FOR SEMICONDUCTOR DEVICE

(71) Applicant: Hitachi Power Semiconductor Device, Ltd., Ibaraki (JP)

(72) Inventors: Tomoyuki Miyoshi, Tokyo (JP); Katsuaki Saito, Hitachi (JP); Tomoyasu Furukawa, Tokyo (JP)

(73) Assignee: MINEBEA POWER SEMICONDUCTOR DEVICE INC., Ibaraki (JP)

( * ) Notice: Subject to any disclaimer, the term of this patent is extended or adjusted under 35 U.S.C. 154(b) by 428 days.

(21) Appl. No.: 18/287,355

(22) PCT Filed: Apr. 8, 2022

(86) PCT No.: PCT/JP2022/017318
§ 371 (c)(1),
(2) Date: Oct. 18, 2023

(87) PCT Pub. No.: WO2022/224840
PCT Pub. Date: Oct. 27, 2022

(65) Prior Publication Data
US 2024/0379830 A1 Nov. 14, 2024

(30) Foreign Application Priority Data
Apr. 23, 2021 (JP) ................................. 2021-073215

(51) Int. Cl.
*H10D 12/00* (2025.01)
*H10D 12/01* (2025.01)
(Continued)

(52) U.S. Cl.
CPC ......... *H10D 12/481* (2025.01); *H10D 12/038* (2025.01); *H10D 62/106* (2025.01);
(Continued)

(58) Field of Classification Search
CPC .. H10D 12/481; H10D 12/038; H10D 62/106; H10D 62/127; H10D 62/393;
(Continued)

(56) References Cited

U.S. PATENT DOCUMENTS

| | | |
|---|---|---|
| 2007/0080407 A1 | 4/2007 | Kono |
| 2012/0015508 A1 | 1/2012 | Iwasaki et al. |

(Continued)

FOREIGN PATENT DOCUMENTS

| | | |
|---|---|---|
| JP | 10-050724 A | 2/1998 |
| JP | 2007-103770 A | 4/2007 |

(Continued)

OTHER PUBLICATIONS

International Search Report of PCT/JP2022/017318 dated Jun. 28, 2022.

(Continued)

*Primary Examiner* — Samuel A Gebremariam
(74) *Attorney, Agent, or Firm* — MATTINGLY & MALUR, PC

(57) ABSTRACT

A semiconductor device has both low conduction loss and low switching loss, and uniformity of heat generation during operation. The semiconductor device has high and low conduction regions in one semiconductor chip, and includes: in the low conduction region, a first carrier control gate connected to a first gate electrode, and a switching gate connected to a second gate electrode controllable independently of the first gate electrode; and in the high conduction region, a second carrier control gate connected to a third gate electrode. In the semiconductor device, of the first carrier (Continued)

control gate and the switching gate, the first carrier control gate is placed at an end portion of the low conduction region on a boundary side with the high conduction region, and a concentration of carriers that can be accumulated at conduction time is lower in the low conduction region than in the high conduction region.

15 Claims, 23 Drawing Sheets

(51) Int. Cl.

| | | |
|---|---|---|
| *H10D 62/10* | (2025.01) | |
| *H10D 62/17* | (2025.01) | |
| *H10D 62/53* | (2025.01) | |
| *H10D 84/60* | (2025.01) | |
| *H10P 32/10* | (2026.01) | |
| *H02M 7/537* | (2006.01) | |
| *H02P 27/06* | (2006.01) | |
| *H03K 17/567* | (2006.01) | |

(52) U.S. Cl.
CPC ......... *H10D 62/127* (2025.01); *H10D 62/393* (2025.01); *H10D 62/53* (2025.01); *H10D 84/617* (2025.01); *H10P 32/171* (2026.01); *H10P 32/18* (2026.01); *H02M 7/537* (2013.01); *H02P 27/06* (2013.01); *H03K 17/567* (2013.01)

(58) Field of Classification Search
CPC .... H10D 62/53; H10D 84/617; H10P 32/171; H10P 32/18; H02M 7/537; H02P 27/06; H03K 17/567
See application file for complete search history.

(56) References Cited

U.S. PATENT DOCUMENTS

| | | |
|---|---|---|
| 2012/0280728 A1 | 11/2012 | Hussein et al. |
| 2012/0286288 A1 | 11/2012 | Hussein et al. |
| 2015/0303288 A1 | 10/2015 | Hashimoto et al. |
| 2016/0254374 A1 | 9/2016 | Kameyama et al. |
| 2018/0145134 A1 | 5/2018 | Nagata |
| 2018/0197853 A1 | 7/2018 | Takahashi |
| 2019/0088745 A1 | 3/2019 | Xue et al. |
| 2020/0412359 A1 | 12/2020 | Van Brunt et al. |
| 2021/0091217 A1 | 3/2021 | Miyoshi et al. |

FOREIGN PATENT DOCUMENTS

| | | |
|---|---|---|
| JP | 2012-238715 A | 12/2012 |
| JP | 2012-249509 A | 12/2012 |
| JP | 2016-162807 A | 9/2016 |
| JP | 2018-085449 A | 5/2018 |
| JP | 2019-145758 A | 8/2019 |
| TW | 201906168 A | 2/2019 |
| WO | 2011/074075 A1 | 6/2011 |
| WO | 2014/038064 A1 | 3/2014 |
| WO | 2016/038695 A1 | 3/2016 |
| WO | 2017/029748 A1 | 2/2017 |

OTHER PUBLICATIONS

Taiwanese Office Action dated Mar. 2, 2023, issued in corresponding Taiwanese Patent Application No. 111115002.

(a)

(b)

(a)

(b)

SEMICONDUCTOR DEVICE, POWER CONVERSION DEVICE USING SAME, AND MANUFACTURING METHOD FOR SEMICONDUCTOR DEVICE

TECHNICAL FIELD

The present invention relates to the structure of a semiconductor device and a method for manufacturing the same, in particular relates to a technology effective when applied to a power semiconductor device for power control.

BACKGROUND ART

The global warming has become an important and urgent problem common to the world, and as one of the countermeasures against it, power electronics technology is expected to be a highly contributing technology. In particular, for enhancing the efficiency of an inverter responsible for power conversion function, there is a demand for the development of a power semiconductor device with lower power consumption, which device constitutes the inverter and is mainly comprised of IGBT (Insulated Gate Bipolar Transistor) that performs a power switching function and a diode that performs a rectifying function.

FIG. 20 is a partial circuit diagram of a representative inverter. To an IGBT 97 having an insulated gate terminal 98, a diode 99 is connected in reversely parallel to the IGBT 97. The inverter is constituted so that the power to be supplied to an inductive load 95 connected thereto is controlled by supplying power from a DC power supply 96, applying a voltage to the insulated gate terminal 98 of the IGBT 97, and repeating turn-on and turn-off at high speed. It is to be noted that the inductive load 95 is, for example, a motor (electric motor).

Since the IGBT 97 and the diode 99 generate a conduction loss at conduction time and generate a switching loss at switching time, it is necessary to reduce the conduction loss and the switching loss of the IGBT 97 and the diode 99 in order to obtain an inverter having a reduced size and enhanced efficiency. Here, the switching loss is composed of the turn-on loss and the turn-off loss generated from the IGBT 97 and the recovery loss generated from the diode 99 at turn-on time.

As a technology of reducing the conduction loss and the turn-off loss of the IGBT, there is known a technology described, for example, in Patent Literature 1 and relating to a double gate (also called "dual gate") IGBT structure having two independently controllable gates.

FIG. 21 is a cross-sectional view of the IGBT described in Patent Literature 1. A gate Gs and a gate Gc both have a trench shape and when for an emitter electrode 7, a high voltage is applied to an insulated gate electrode 91 of the gate Gs and an insulated gate electrode 92 of the gate Gc, an electron layer, which is an inversion layer, is formed on the gate electrode interface of a p type well layer 2. When a forward voltage is applied between a collector electrode 8 and the emitter electrode 7, therefore, an electron carrier is injected in an n− type drift layer 1 via the electron layer formed from the emitter electrode 7 to the surface of the insulated gate electrode (Gs) 91 and the insulated gate electrode (Gc) 92 to draw a hole carrier from a p type collector layer 4, cause conductivity modulation inside the n− type drift layer 1, and place the IGBT in a conduction state.

Next, at turn-off time, a carrier that has contributed to conductivity modulation by applying, to the gate, a voltage less than the threshold voltage at which an inversion layer is not formed on the gate electrode interface of the p type well layer 2 is discharged to the emitter electrode 7 and the collector electrode 8 to place the IGBT in a non-conduction state. The current generated at this time and a backward voltage applied to the emitter electrode 8 and the collector electrode 8 then cause a power loss called "turn-off loss".

Here, in the present structure having two independently controllable gates, a voltage less than the threshold voltage can be applied to the insulated gate electrode (Gc) 92 just before turn-off prior to the insulated gate electrode (Gs) 91 and thus, a drift region having controlled conductivity modulation and having a reduced carrier concentration can be formed temporarily. This makes it possible to reduce a current due to a carrier discharged at turn-off time and in addition, a turn-off loss can be reduced because a backward voltage is applied at high speed between the collector electrode 8 and the emitter electrode 7.

In short, provided is a technology capable of dynamically controlling the concentration of carriers accumulated in the n− type drift layer 1 by changing, between just before the conduction state and just before the non-conduction state, a gate bias to be applied to the insulated gate electrode (Gs) 91 and the insulated gate electrode (Gc) 92 and capable of reducing a loss generated at turn-off time by this control.

As another mode of the double gate structure, known is a technology of temporarily reducing the concentration of carriers accumulated in the vicinity of a collector region to reduce a current at turn-off time, for example, a technology described in Patent Literature 2 and relating to a structure in which two IGBTs different in collector injection efficiency are connected in parallel to each other.

FIG. 22 is a circuit diagram of the IGBT described in Patent Literature 2. The IGBT has two IGBTs 33 and 34 different in structure and they are connected in parallel to each other to perform a switching function of the IGBT. These two IGBTs 33 and 34 have respectively different structures. In the IGBT 33, a carrier injection efficiency is high and an on-voltage is low, while in the IGBT 34, an injection efficiency is low and an on-voltage is high. They control their gates 35 and 36, independently.

Here, the carrier injection efficiency is adjusted by an impurity concentration in the collector region of the IGBTs 33 and 34 or a carrier lifetime control amount in the drift region. In a conduction state, by applying a voltage equal to or more than the threshold voltage to the respective gates 35 and 36 of the two IGBTs 33 and 34, the two IGBTs 33 and 34 both become conductive and they have a low on-voltage.

At turn-off time, by applying a voltage less than the threshold voltage to the gate 35 of the low on-voltage IGBT 33 first, only the high on-voltage IGBT 34 is placed in a conduction state. By using such control, a low carrier concentration state can be formed temporarily and when a voltage less than the threshold voltage is applied subsequently to the high on-voltage IGBT 34 to shift it to a non-conduction state, a current due to carrier discharge can be reduced.

The advantage of this technology having the aforesaid constitution and control is that a current at turn-off time can be reduced because the carrier concentration in the drift region in the vicinity of the collector region, here an average carrier concentration between elements arranged in parallel can be controlled and an average carrier concentration can be reduced temporarily by causing the conduction of only the high on-voltage IGBT 34.

As a double gate semiconductor device for use in the above-described inverter shown in FIG. 20, for example, a technology described in Patent Literature 3 is known.

Patent Literature 3 discloses a semiconductor device comprised of an IGBT 51 having only a Gc gate 92 and having a p type collector 4A whose impurity concentration is set high and an IGBT 52 having a Gs gate 91 and a Gc gate 92 and having a p type collector 4B whose impurity concentration is set low (such as FIG. 2 of Patent Literature 3).

CITATION LIST

Patent Literature

PTL 1: International Publication No. 2014/038064
PTL 2: Japanese Unexamined Patent Application Publication No. 2012-249509
PTL 3: Japanese Unexamined Patent Application Publication No. 2019-145758

SUMMARY OF INVENTION

Technical Problem

Although in the IGBT structure described in Patent Literature 1, the concentration of a carrier in the n– type drift layer 1 in the vicinity of the p type well layer 2 can be adjusted by the bias control of the insulated gate electrode (Gc) 92, it is difficult to control the carrier concentration in the vicinity of the p type collector layer 4.

As the thickness of a substrate constituting the IGBT is larger, in other words, a distance between an n type emitter layer 3 and the p type collector layer 4 is wider and the structure becomes a higher breakdown voltage one, such a tendency becomes more marked, and an effect of controlling carriers of the double-gate IGBT is reduced. Accordingly, at turn-off time, a current generated by the discharge of carriers accumulated at a high concentration in the n– type drift layer 1 particularly in the vicinity of the p type collector layer 4 is large and a turn-off loss reduction effect by the double-gate IGBT decreases.

In the IGBT structure described in Patent Literature 2, controlling the carrier concentration in the drift region of the high on-voltage IGBT 34 in the vicinity of the emitter region is difficult and control of turn-off is started under the state of a high carrier concentration so that during the transition of a voltage between a collector and an emitter to a backward voltage, a turn-off loss reduction effect is small due to a slow depletion speed inside the drift region and a long voltage transition time.

In addition, due to a 2-chip constitution to which respectively different impurity concentrations or carrier lifetimes are applied, a temperature imbalance inside the IGBT occurs between the 2 chips due to the power generated at conduction time or turn-off switching time. There is therefore a reliability issue or a concern that a conductive current value cannot be raised to the maximum allowable current defined by the maximum bonding temperature.

As described above, in the structure of Patent Literature 1, the carrier concentration in the drift region of the IGBT in the vicinity of the emitter region can temporarily be decreased and therefore, a high voltage is applied at high speed at turn-off time. On the other hand, increasing a current reduction speed is difficult and a turn-off loss reduction effect is small.

In the structure of Patent Literature 2, although a current reduction speed can be raised at turn-off time by temporarily decreasing the carrier concentration in the drift region of the IGBT in the vicinity of the collector region, increasing of a high-voltage application speed is difficult and a turn-off loss reduction effect is small. In addition, there is a concern with a temperature imbalance between 2 chips.

In the conventional double gate IGBTs described in Patent Literatures 1 and 2, therefore, the IGBT loss reduction effect is small. In Patent Literature 2, it has a problem with temperature uniformity when heat is generated by operation and it is difficult to realize capacity enlargement by increasing of the allowable current amount.

In the semiconductor device described in Patent Literature 3, IGBT 51 and IGBT 52 are supposed to be comprised of respectively different chips, for example, as shown in FIG. 2. They may cause a difference in heat generation temperature between IGBT 51 and IGBT 52 when the semiconductor device is downsized or operated and therefore, have room for further improvement.

An object of the present invention is therefore to provide a high-reliability semiconductor device having both a low conduction loss and a low switching loss and excellent in the uniformity of a heat generation temperature during operation; and a method of manufacturing the semiconductor device.

Solution to Problem

In order to solve the above problem, this invention provide a semiconductor device having a high conduction region and a low conduction region in one semiconductor chip, and comprising: in the low conduction region, a first carrier control gate connected to a first gate electrode, and a switching gate connected to a second gate electrode controllable independently of the first gate electrode; and in the high conduction region, a second carrier control gate connected to a third gate electrode. In the semiconductor device, of the first carrier control gate and the switching gate, the first carrier control gate is placed at an end portion of the low conduction region on a boundary side with the high conduction region, and a concentration of carriers that can be accumulated at conduction time is lower in the low conduction region than in the high conduction region.

Advantageous Effects of Invention

The present invention can realize a high-reliability semiconductor device having both a low conduction loss and a low switching loss and excellent in the uniformity of a heat generation temperature during operation; and a method of manufacturing the semiconductor device.

This enables capacity enlargement and reliability improvement of a semiconductor device and a power conversion device using the same.

A problem, constitution, and advantageous effect other than those described above will be revealed by the description in the following embodiments.

DESCRIPTION OF EMBODIMENTS

Figure 1:
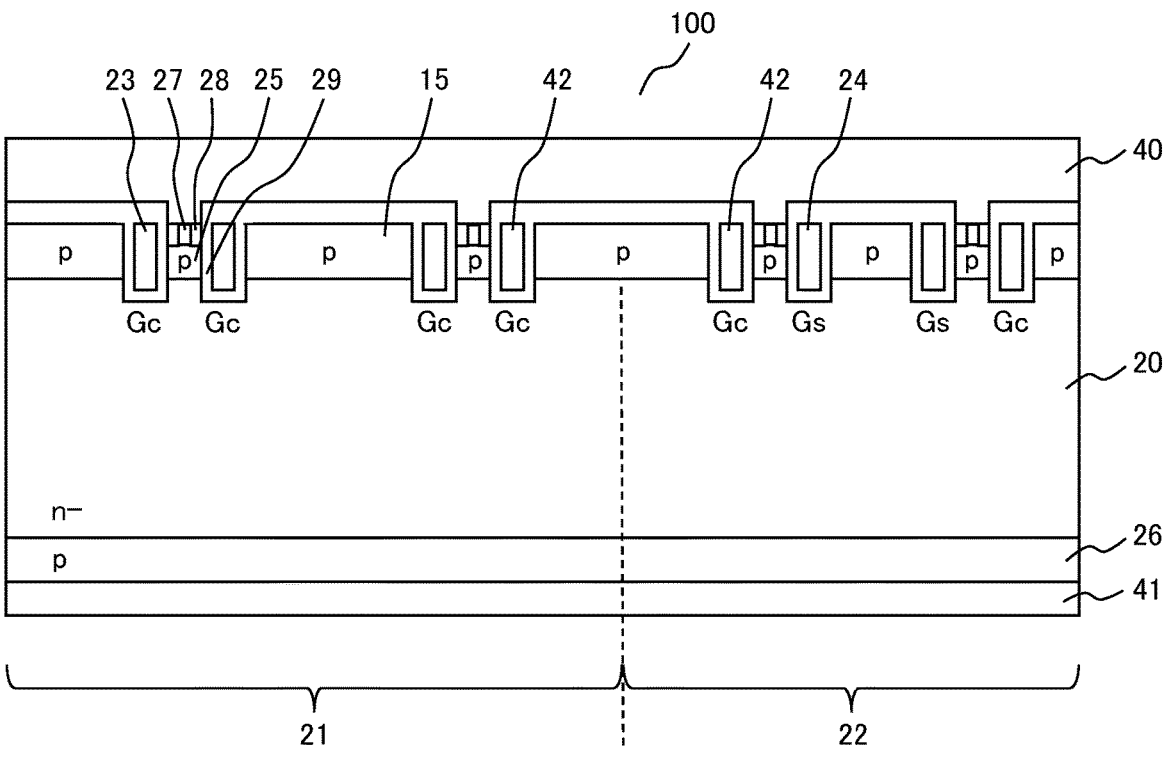
FIG. 1 is a cross-sectional view of a semiconductor device of First Embodiment of the present invention.

Embodiments of the present invention will hereinafter be described referring to the drawings. In each of the drawings, the same constitution will be identified by the same reference numeral and a detailed description will be omitted from an overlapping part.

The term "n–" or "n" in the drawings indicate that the semiconductor layer indicated thereby is an n type one and the impurity concentration of "n" is relatively higher than the impurity concentration of "n–". The term "p–" or "p" indicate that the semiconductor layer indicated thereby is a p type one and the impurity concentration of "p" is relatively higher than the impurity concentration of "p–".

Embodiment 1

Referring to FIGS. 1 to 6, the insulated gate (gate controlled) semiconductor device of Embodiment 1 of the present invention will be described. FIG. 1 is a cross-sectional view of a semiconductor device 100 of the present embodiment.

The semiconductor device 100 of the present embodiment is a double gate IGBT having a plurality of trench gate shapes and it has a high conduction region 21 and a low conduction region 22 in the same n– type drift layer 20. The high conduction region 21 is a region in which high concentration carriers can be accumulated at the IGBT conduction time, while the low conduction region 22 is a region in which carriers with a concentration lower than that in the high conduction region 21 can be accumulated at the IGBT conduction time.

A plurality of trench gates placed in the upper portion of the high conduction region 21 is connected to a carrier control gate (Gc) 23. On the other hand, a plurality of trench gates placed in the upper portion of the low conduction region 22 is connected to a carrier control gate (Gc) 23 and a switching gate (Gs) 24.

The semiconductor device 100 also has a p type well layer 25 vertically contiguous to the n– type drift layer 20 and a p type collector layer 26 vertically continuous to the n– type drift layer 20 on the side opposite to the p type well layer 25.

Further, the p type well layer 25 has thereon a p type feeder layer 27 and an n type emitter layer 28 which are contiguous to each other. These p type well layer 25 and n type emitter layer 28 are in contact with the carrier control gate (Gc) 23 which is a trench-gate type first insulated gate having a gate electrode via a gate insulating film (gate oxide film) 29 and a switching gate (Gs) 24 which is a trench gate type second insulated gate.

An emitter electrode 40 has a trench shape protruding downward and is in contact with the p type feeder layer 27 and the n type emitter layer 28. The trench gates are isolated from each other via the gate insulating film 29. The n– type drift layer 20 is contiguous to the p type collector layer 26 at the surface on the counter electrode side of the p type well layer 25 and has a collector electrode 41 contiguous to the p type collector layer 26. In the semiconductor device 100, the n– type drift layer 20, the emitter electrode 40, and the collector electrode 41 are each common in the high conduction region 21 and the low conduction region 22 and they are formed inside a semiconductor element on a single chip.

The respective conductivities of the high conduction region 21 and the low conduction region 22 are determined by the distance of the p type well layers 25 sandwiched between two trench gates, the concentration of the p type collector layer 26, or the carrier lifetime in the n– type drift layer 20. The carrier control gate (Gc) 42 of the high conduction region 21 and the carrier control gate (Gc) 42 of the low conduction region 22, each placed at the end portion on the side of a boundary between the high conduction region 21 and the low conduction region 22, are placed adjacent to each other. This constitution is intended to achieve a carrier concentration reduction effect during a carrier extraction term shown below.

The semiconductor substrate used in the present embodiment is made of, for example, silicon (Si) or silicon carbide (SiC) and the gate insulating film 29 is made of, for example, silicon dioxide (SiO₂).

Next, the operation of the semiconductor device 100 of the present embodiment will be described referring to FIGS. 2 to 4.

Figure 2:
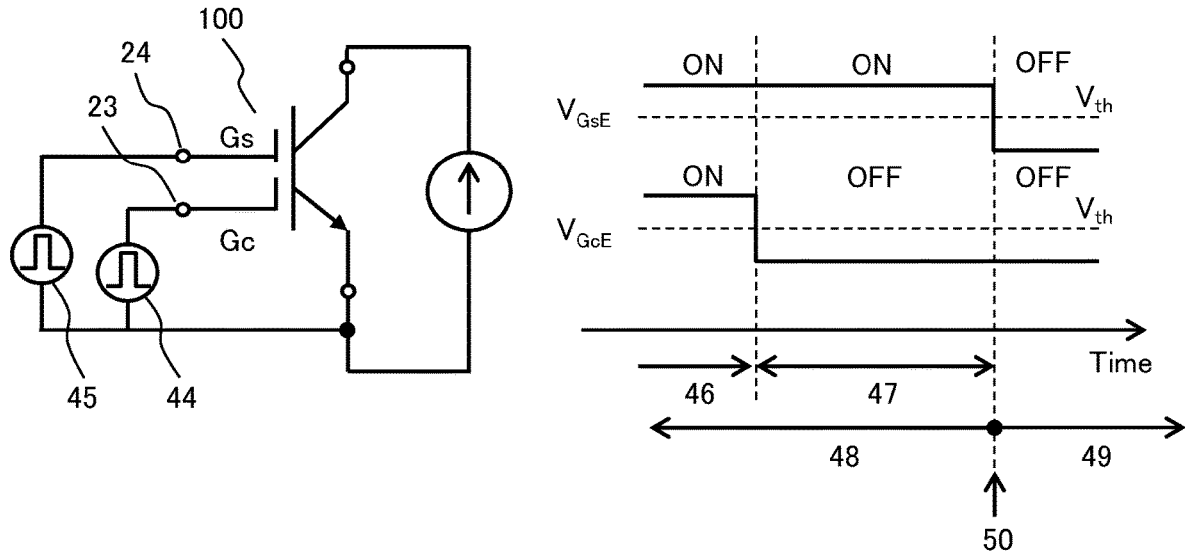
FIG. 2 includes a drive circuit diagram and a drive signal diagram when the semiconductor device shown in FIG. 1 is used.

FIG. 2 shows a drive circuit diagram and drive signals when the semiconductor device 100 of the present embodiment is used.

The semiconductor device 100 of the present embodiment achieves low-loss operation with drive signals from gate drivers 44 and 45 that respectively drive the carrier control gate (Gc) 23 and the switching gate (Gs) 24.

Indicated by reference numeral 48 on the right diagram of FIG. 2 is an IGBT conduction term and indicated by reference numeral 49 is a non-conduction term.

First, during the IGBT conduction term, a high conduction term 46 during which a voltage equal to or more than a threshold voltage for forming an inversion layer in the p type well layer 25 of the IGBT is applied, and a low conduction term 47 during which a voltage less than the threshold voltage is applied to the carrier control gate (Gc) 23 and a voltage equal to or more than the threshold voltage is applied to the switching gate (Gs) 24 are set.

During the high conduction term 46, an accumulated carrier concentration inside the IGBT increases and low on-voltage performance is induced. During the low conduction term 47, an accumulated carrier concentration inside the IGBT decreases. Then, when a voltage less than the threshold voltage is applied to the switching gate (Gs) 24 to turn off the IGBT, a reverse-blocking voltage is applied to the IGBT at high speed and a current decreases at high speed, making it possible to realize low-loss turn-off switching 50.

In short, low-loss IGBT performance is introduced by driving the IGBT structure of the present embodiment shown on the left diagram of FIG. 2 with the drive signals as shown on the right diagram of FIG. 2.

Figure 3:
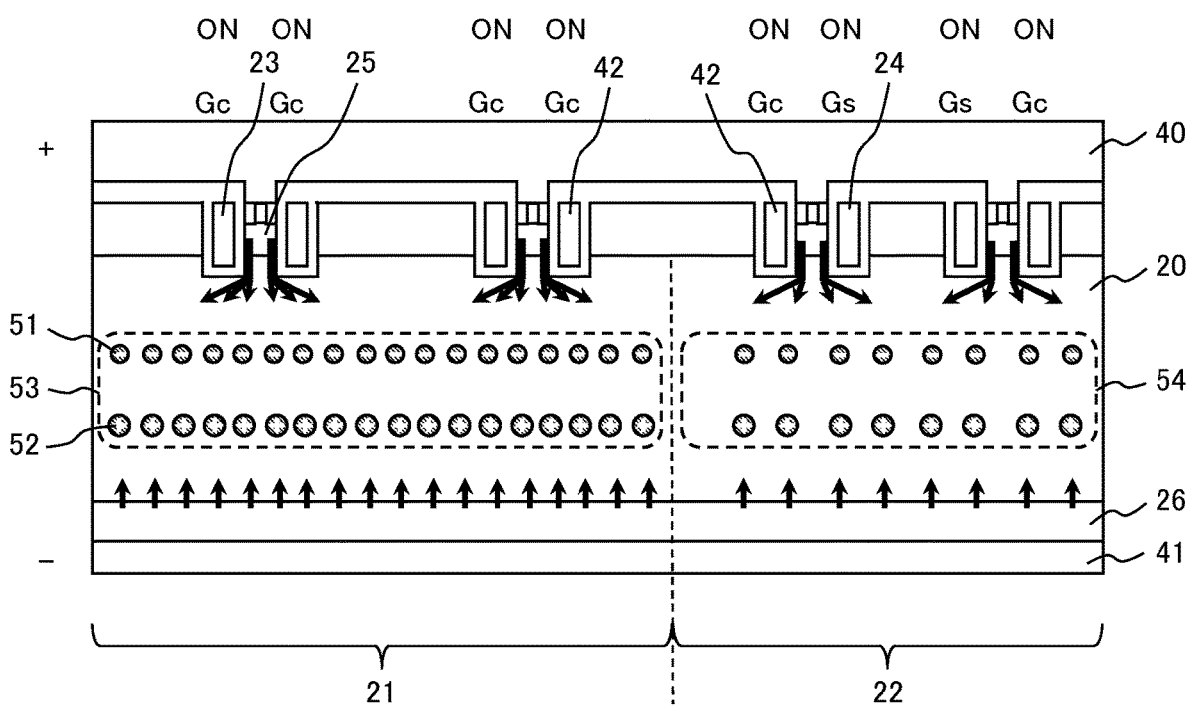
FIG. 3 is a schematic view of a carrier distribution in a high conduction period of the semiconductor device shown in FIG. 1.

FIG. 3 shows the carrier distribution of the semiconductor device 100 of the present embodiment during the high conduction term 46. It shows the distribution of the carriers of an electron 51 and a hole 52 when a positive voltage equal to or more than the threshold voltage capable of forming an electron layer, which is an inversion layer, in the p type well layer 25 is applied to the carrier control gate (Gc) 23 and the switching gate (Gs) 24 and a forward voltage that conducts the IGBT is applied between the collector electrode 41 and the emitter electrode 40.

Electrons 51 are injected from the emitter electrode into the n− type drift layer 20 through an electron layer formed in the p type well layer 25. In the n− type drift layer 20, holes 52 are injected from the p type collector layer 26, induced by the injected electrons 51. This causes conductivity modulation inside the n− type drift layer 20.

Here, the semiconductor device 100 of the present embodiment has a high conduction region 21 in which, for example, the distance (pitch) between the p type well layers is wide and holes 52 are difficult to pass through into the emitter electrode 40. This makes it possible to enhance the concentration of accumulated carriers due to conductivity modulation in this high conduction region 21.

In the semiconductor device 100 of the present embodiment, therefore, a predetermined current can be applied at a low voltage drop, that is, a low on-voltage so that low-loss performance at conduction time is induced.

Figure 4:
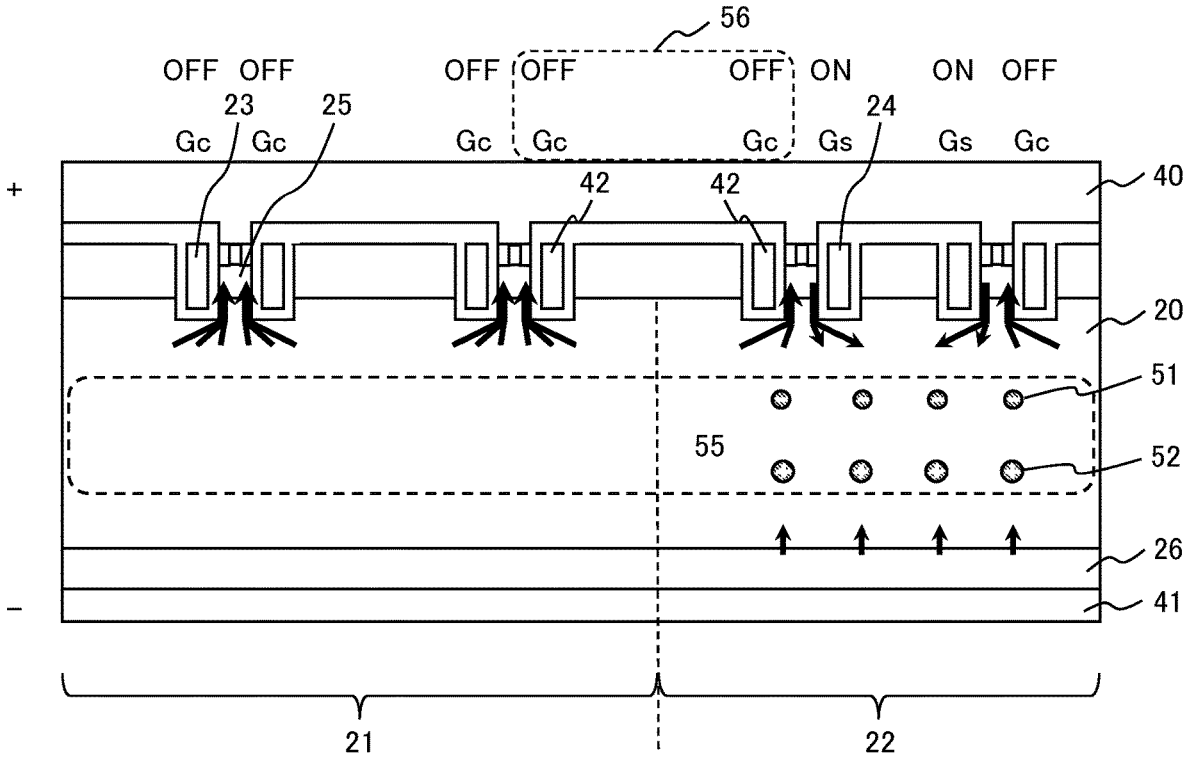
FIG. 4 is a schematic view of a carrier distribution in a low conduction period of the semiconductor device shown in FIG. 1.

FIG. 4 shows the carrier distribution of the semiconductor device 100 of the present embodiment during the low conduction term 47 following the high conduction term 46 and in this low conduction term, a negative voltage less than the threshold voltage is applied to the carrier control gate (Gc).

When a forward voltage that conducts the IGBT is applied to between the collector electrode 41 and the emitter electrode 40, an accumulated layer of the holes 52 is formed in the p type well layer 25 adjacent to the carrier control gate (Gc) 23, and the holes 52 contributing to the conductivity modulation inside the n− type drift layer 20 are discharged to the emitter electrode 40 via the accumulated layer.

The semiconductor device 100 of the present embodiment has a low conduction region 22. Since due to, for example, a narrow pitch between the p type well layers 25, the holes 52 contributing to the conductivity modulation are likely to be discharged to the emitter electrode 40 via the accumulated layer by the carrier control gate (Gc) 23. In addition, the injection of the electrons 51 is continued via the inversion layer by the switching gate (Gs) 24 so that a profile of the accumulated carriers 55 having an ultralow concentration can be formed stably in the n− type drift layer 20.

Of the carrier control gate (Gc) 42 and the switching gate (Gs) 24, the carrier control gate (Gc) 42 is placed at the end portion of the low conduction region 22 at the boundary with the high conduction region 21, making it possible to efficiently discharge, via an accumulated layer by the carrier control gate (Gc) 42, accumulated carriers at the boundary portion between the low conduction region 22 and the high conduction region 21 in the n− type drift layer 20, and to prevent injection of the electrons 51 into the high conduction region 21 from the switching gate (Gs) 24 of the low conduction region 22, thereby uniformly reducing the concentration of the accumulated carriers in the low conduction region 22.

When an off-bias is applied to the switching gate (Gs) 24 under the aforesaid state and the semiconductor device 100 shifts to the turn-off switching operation by which it transitions from the conduction state to the non-conduction state, the holes 52 and the electrons 51 are discharged to the emitter electrode 40 and the collector electrode 41, respectively, at high speed because of a low accumulated carrier concentration inside the n− type drift layer 20. Therefore, a reverse-blocking voltage is applied to the IGBT at high speed and in addition, a current reducing operation is caused at high speed so that low-loss turn-off switching is realized.

In short, an accumulated carrier concentration inside the IGBT can be controlled by a gate bias of the carrier control gates (Gc) 24 and 42 and particularly, controllability of the concentration can be enhanced by the present invention. As a result, an IGBT satisfying both low on-voltage performance and low turn-off loss performance at conduction time can be realized.

Figure 5:
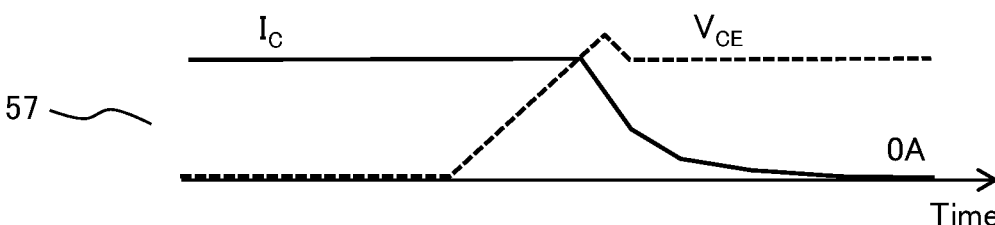
FIG. 5 includes views showing a turn-off switching waveform and a power loss.
Figure 5:
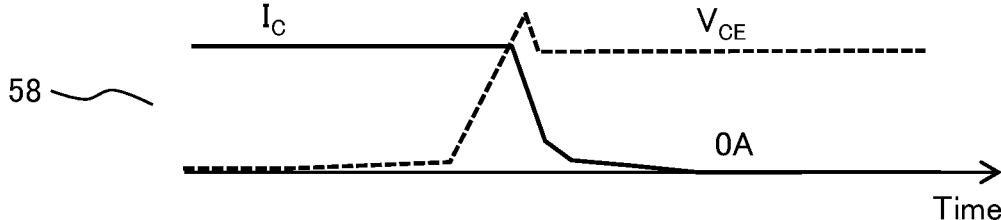
Figure 5:
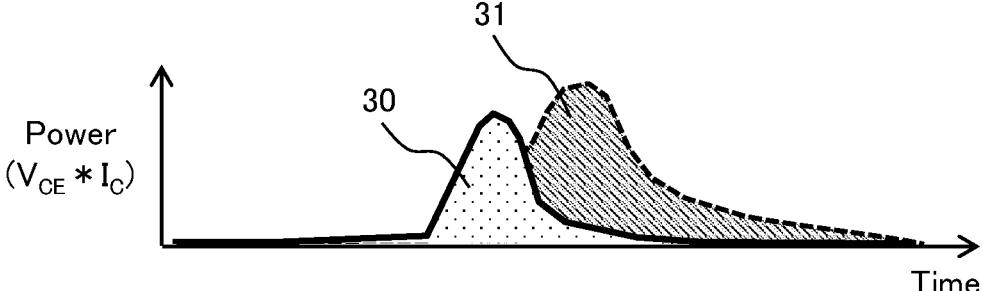

Next, the advantageous effect of the present invention on a power loss and in-chip temperature uniformity will be described referring to FIGS. 5 and 6. FIG. 5 shows comparison between the turn-off switching waveform 58 of the double-gate IGBT of the present invention and the turn-off switching waveform 57 of a conventional double-gate IGBT based on Patent Literature 1.

The IGBT shifts from a conduction state to a non-conduction state when an off-bias is applied to the switching gate (Gs) 24. FIG. 5 shows respective changes, at this time, in a collector current $I_C$ and a collector-emitter voltage $V_{CE}$ and also power Power as the product of $I_C$ and $V_{CE}$.

When an off-bias is applied to the switching gate (Gs) 24, carriers inside the IGBT are discharged and $V_{CE}$ rises first. In the double gate IGBT of the present invention, since the carrier concentration during the immediately preceding low conduction term 47 is low, the $V_{CE}$ rises to a supply voltage at high speed compared with the conventional type. This phenomenon occurs primarily due to the carrier concentration reduction effect of the present invention in the drift region in the vicinity of the emitter region, that is, in a region near the surface.

Next, when $V_{CE}$ reaches a supply voltage, a reduction in $I_C$ starts. In the double gate IGBT of the present invention, since the carrier concentration during the low conduction term 47, particularly, the carrier concentration in the drift region in the vicinity of the collector region, that is, near the back surface is low, the collector current $I_C$ decreases at high speed and reaches 0 A with a short tail term, and the IGBT shifts to a non-conduction state. This means that according to the double gate IGBT of the present invention, both the collector-emitter voltage $V_{CE}$ and the collector current $I_C$ can be changed at high speed compared with the conventional type.

A power loss at the turn-off switching time can be calculated by integrating the power Power due to these changes in $V_{CE}$ and $I_C$. As shown in FIG. 5, it is apparent that in the double gate IGBT of the present invention, the power loss 30 generated therein is smaller than the conventional power loss 31 because the $V_{CE}$ and $I_C$ change terms are short.

Figure 6:
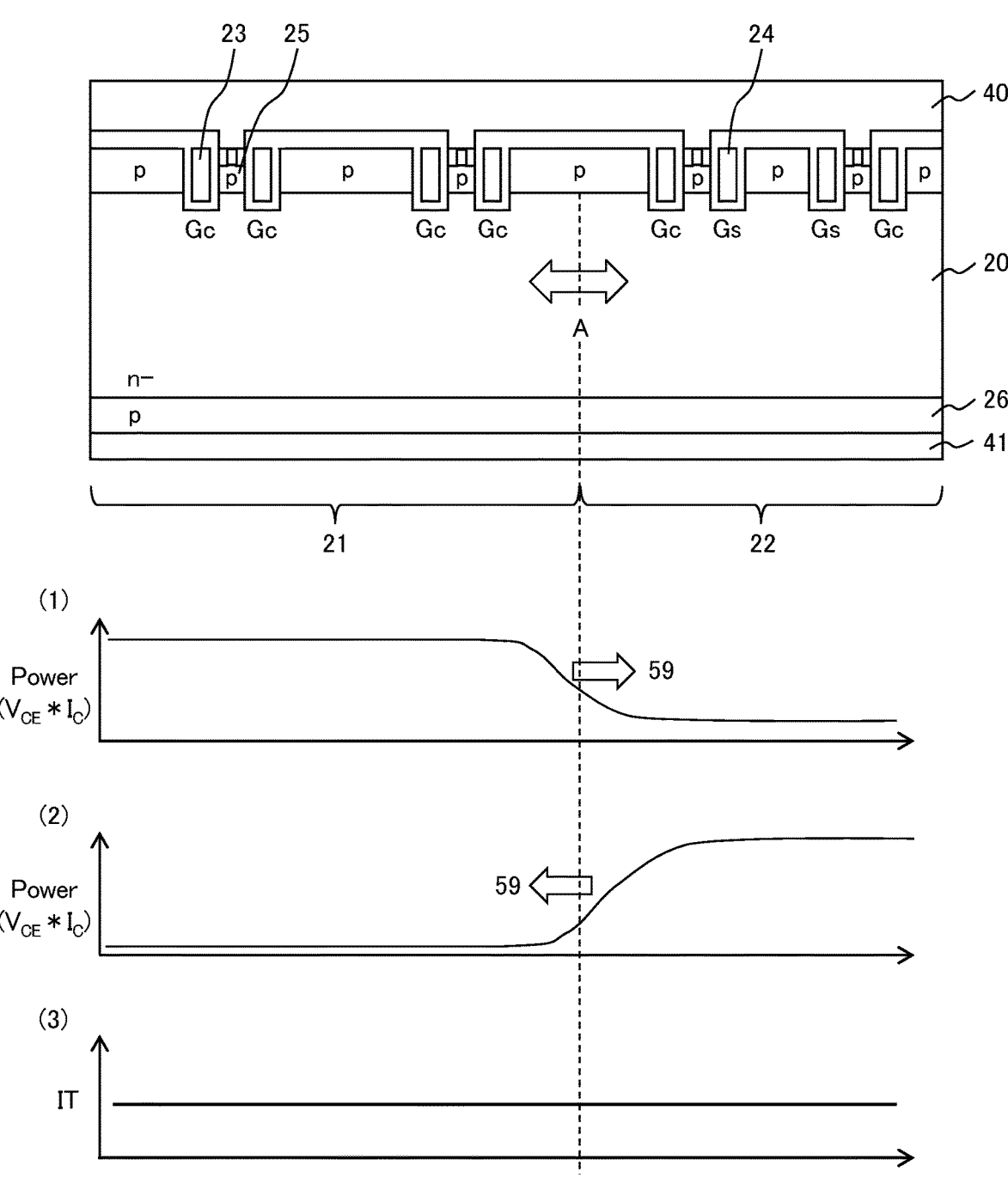
FIG. 6 includes schematically showing power generated at conduction time and turn-off switching time of the semiconductor device shown in FIG. 1 and distribution of an inner temperature associated with the power thus generated.

FIG. 6 schematically shows, in the high conduction region 21 and the low conduction region 22 of the double gate IGBT of the present invention, power generated at conduction time and turn-off switching time and the distribution of inner temperatures depending on the power thus generated. In this diagram, powers generated at conduction time and turn-off switching time are shown in (1) and (2), respectively and an inner temperatures in a steady state formed by the repetition of conduction and switching is shown in (3).

In the present invention, the high conduction region 21 and the low conduction region 22 are both formed inside the common n– type drift layer 20 and small heat resistance between these regions brings about an effect on temperature uniformity.

As shown in (1) of FIG. 6, at the IGBT conduction time, with an increase in an accumulated carrier concentration in the high conduction region 21, the amount of a current that flows through the low conduction region 22 increases and therefore, power generated in this region is larger than that in the low conduction region 22. Due to a small heat resistance between these regions, thermal diffusion 59 occurs from the high conduction region 21 to the low conduction region 22 inside the common n– type drift layer 20.

Next, at the turn-off switching time of the IGBT shown in (2), carriers are accumulated mainly in the low conduction region 22 in the last low conduction term 47 so that the current at turn-off time is larger in the low conduction region 22 than in the high conduction region 21. Therefore, the power thus generated is larger in the low conduction region 22 than in the high conduction region 21. Since heat resistance between these regions is also small here, heat diffusion 59 occurs from the low conduction region 22 to the high conduction region 21 inside the common drift layer.

Although there is an imbalance in heat generation between the regions caused by these operations (1) and (2), small heat resistance between the regions acts to cause a heat diffusion effect to one of the regions to the other region. As shown in (3), the steady-state inner temperature formed by repeating conduction and switching is able to have high temperature-uniformity from the high conduction region 21 to the low conduction region 22.

Thus, the semiconductor device 100 (double gate IGBT) of the present embodiment achieves the low-loss performance that simultaneously satisfies a low-conduction loss and a low turn-off loss and the in-chip uniformity for a temperature rise caused by the power generated at conduction time and turn-off switching time.

Embodiment 2

Figure 7:
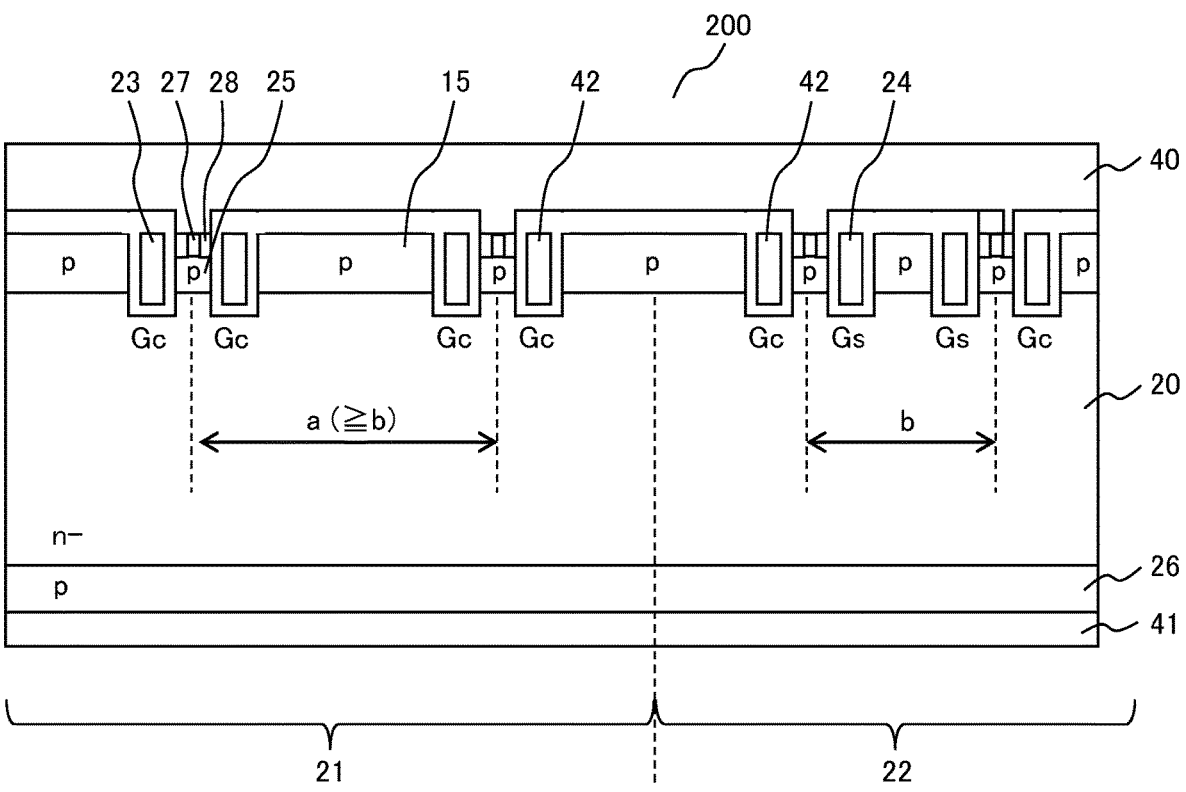
FIG. 7 is a cross-sectional view of a semiconductor device of Second Embodiment of the present invention.

An insulated gate (gate controlled) semiconductor device of Embodiment 2 of the present invention will be described referring to FIGS. 7 and 8. FIG. 7 is a cross-sectional view of the semiconductor device 200 of the present embodiment.

The semiconductor device 200 of the present embodiment is a double gate IGBT having a plurality of trench gate shapes and has a high conduction region 21 and a low conduction region 22 in a common n– type drift layer 20. The high conduction region 21 is a region in which high-concentration carriers can be accumulated at the IGBT conduction time, while the low conduction region 22 is a region in which carriers with a concentration lower than that in the high conduction region 21 can be accumulated at the IGBT conduction time.

Here, in the present embodiment, supposing that a distance between two p type well layers 25 that constitute the high conduction region 21 and are adjacent to each other is defined as "a" and that in the low conduction region 22 is defined as "b", the following relationship is satisfied: a≥b.

When the distance between the p type well layers 25 is wide, holes 52 injected from a collector electrode 41 to the n– type drift layer 20 are less likely to be discharged into an emitter electrode 40 through the p type well layer 25. In other words, such a distance is effective for enhancing the conductivity modulation in the n– type drift layer 20.

Therefore, setting the distance "a" in the high conduction region 21 at equal to or more than the distance "b" (a≥b) in the low conduction region and at the same time, placing a carrier control gate (Gc) 42, of the carrier control gate (Gc) 42 and a switching gate (Gs) 24, at the end portion of the low conduction region 22 on the boundary side with the high conduction region 21 are effective for enhancing the controllability of the accumulated carrier concentration by the bias of the carrier control gate (Gc) 42. As a result, similar to Embodiment 1, the advantageous effects of the present invention, that is, low-loss performance and temperature uniformity can be achieved.

Figure 8:
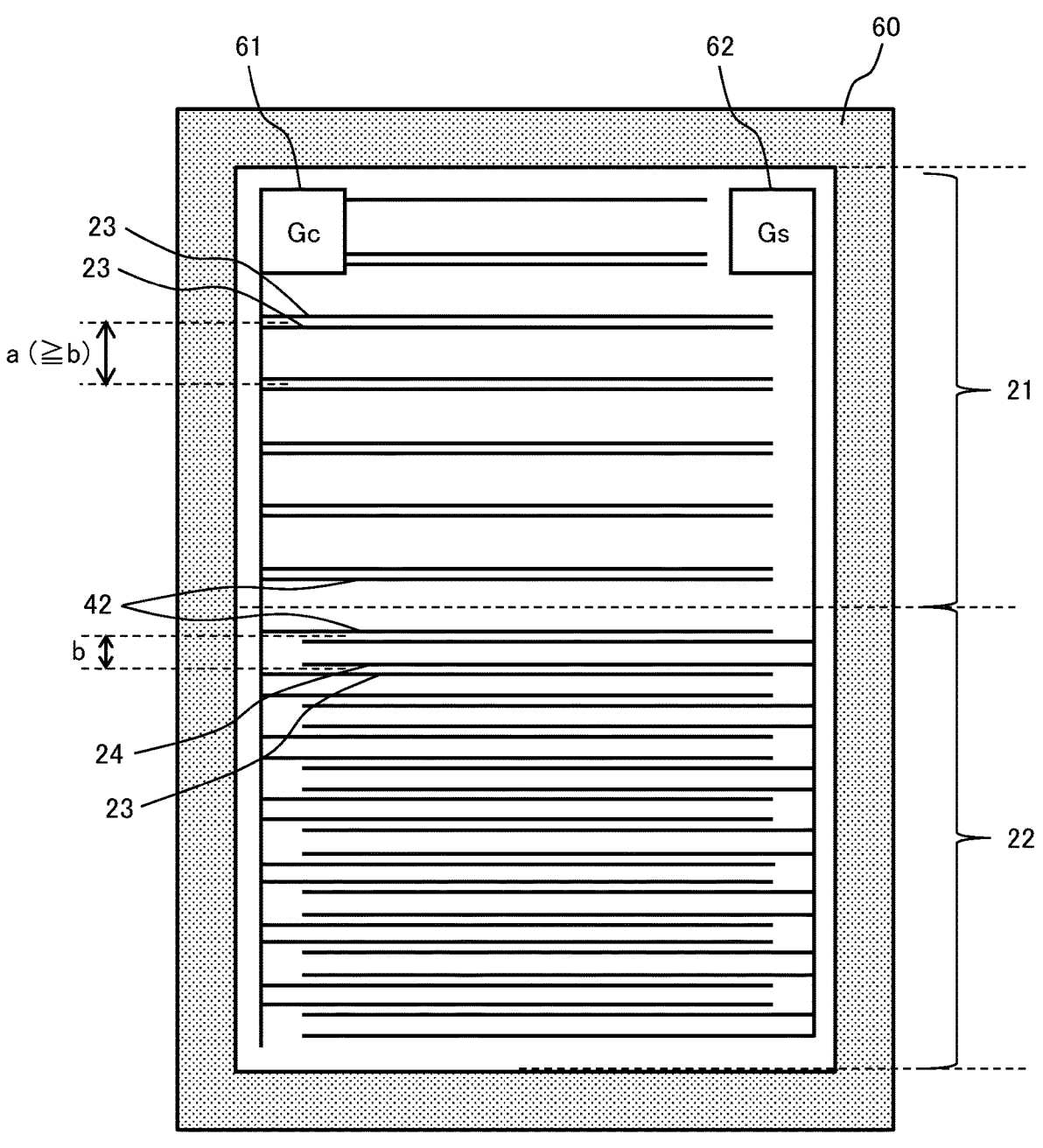
FIG. 8 is a planar layout view of the semiconductor device shown in FIG. 7.

FIG. 8 is a planar layout view of the semiconductor device 200 shown in FIG. 7.

In the semiconductor device 200 of the present embodiment, as shown in FIG. 8, the high conduction region 21 and the low conduction region 22 are placed inside a common field relaxing region 60 placed at the periphery of the chip, and well regions are placed to satisfy a≥b, more preferably a≥b provided that "a" is a distance of the well region sandwiched between two carrier control gates (Gc) 23 and 42 in the high conduction region 21 and "b" is a distance of the well region sandwiched between a carrier control gate (Gc) 42 and a switching gate (Gs) 24 in the low conduction region 22.

A plurality of carrier control gates (Gc) 23 and a plurality of switching gates (Gs) 24 are connected respectively to a pad electrode 61 of the carrier control gate (Gc) and a pad electrode 62 of the switching gate (Gs), which are placed in one chip, and they are constituted to permit application of a control bias from the outside.

A wiring for the carrier control gate (Gc) 23 and the switching gate (Gs) 24 is made of, for example, polysilicon embedded under the emitter electrode 40.

The foresaid constitution enables wiring between the high conduction region 21 and the low conduction region 22 and between the carrier control gate (Gc) 23 and the switching gate (Gs) 24 inside one chip and similar to Embodiment 1, the advantageous effects of the present invention, that is, low loss performance and temperature uniformity can be obtained.

Thus, by the semiconductor device 200 (double gate IGBT) of the present embodiment, low-loss performance that simultaneously satisfies a low-conduction loss and a low turn-off loss and in-chip uniformity for a temperature rise caused by the power generated at conduction time and turn-off switching time can be achieved.

Embodiment 3

Figure 9:
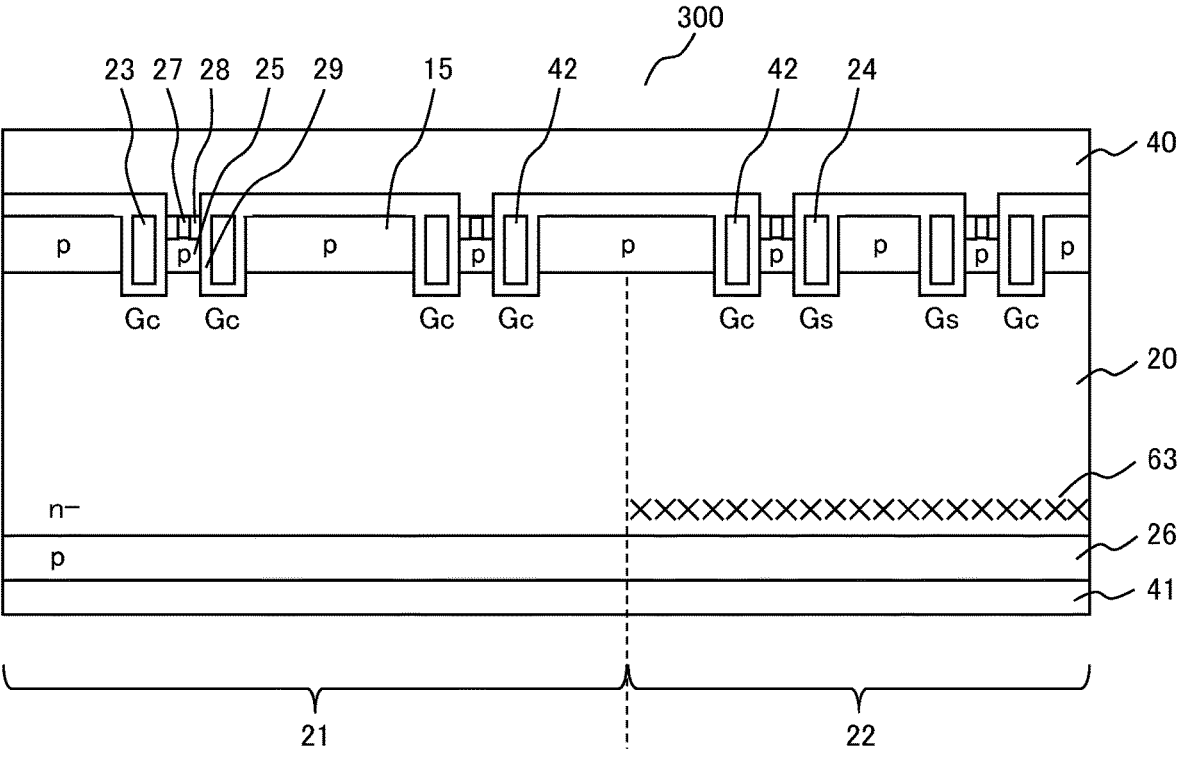
FIG. 9 is a cross-sectional view of a semiconductor device of Third Embodiment of the present invention.

The insulated gate (gate controlled) semiconductor device of Embodiment 3 of the present invention will be described referring to FIGS. 9 to 11, 23, 24A, and 24B. FIG. 9 is a cross-sectional view of a semiconductor device 300 of the present embodiment.

The semiconductor device 300 of the present embodiment is a double gate IGBT having a plurality of trench gate shapes and it has a high conduction region 21 and a low conduction region 22 in a common n– type drift layer 20. The high conduction region 21 is a region in which high-concentration carriers can be accumulated at the IGBT conduction time, while the low conduction region 22 is a region in which carriers with a concentration lower than that in the high conduction region 21 can be accumulated at the IGBT conduction time.

Here, in the present embodiment, by making the carrier lifetime of the n– type drift layer 20 that constitutes the high conduction region 21 higher than that of the low conduction region 22, the concentration of carriers which can be accumulated during a high conduction term 46 at conduction time can be enhanced and at the same time, the concentration of carriers which can be accumulated in the low conduction region 22 during a low conduction term 47 can be reduced. This means that by the carrier control gate (Gc) 23, high controllability of an accumulated carrier concentration can be obtained.

In the present embodiment, a carrier lifetime killer layer 63 is placed in the low conduction region 22 to vary a carrier lifetime in the n– type drift layer 20. The carrier lifetime killer layer 63 is a crystal defect and is formed by exposure to light ions such as helium or proton.

The high conduction region 21 has no carrier lifetime killer layer therein and the drift layer is formed so as to be able to enhance the accumulated carrier concentration; the low conduction region 22 has a carrier lifetime killer 63 and the drift layer is formed to be able to reduce the accumulated carrier concentration; and of the carrier control gate (Gc) 42 and the switching gate (Gs) 24, the carrier control gate (Gc) 42 is placed at the end portion of the low conduction region 22 on the boundary side with the high conduction region 21. As a result, similar to Embodiment 1, the advantageous effects of the present invention, that is, low loss performance and temperature uniformity can be obtained.

Figure 10:
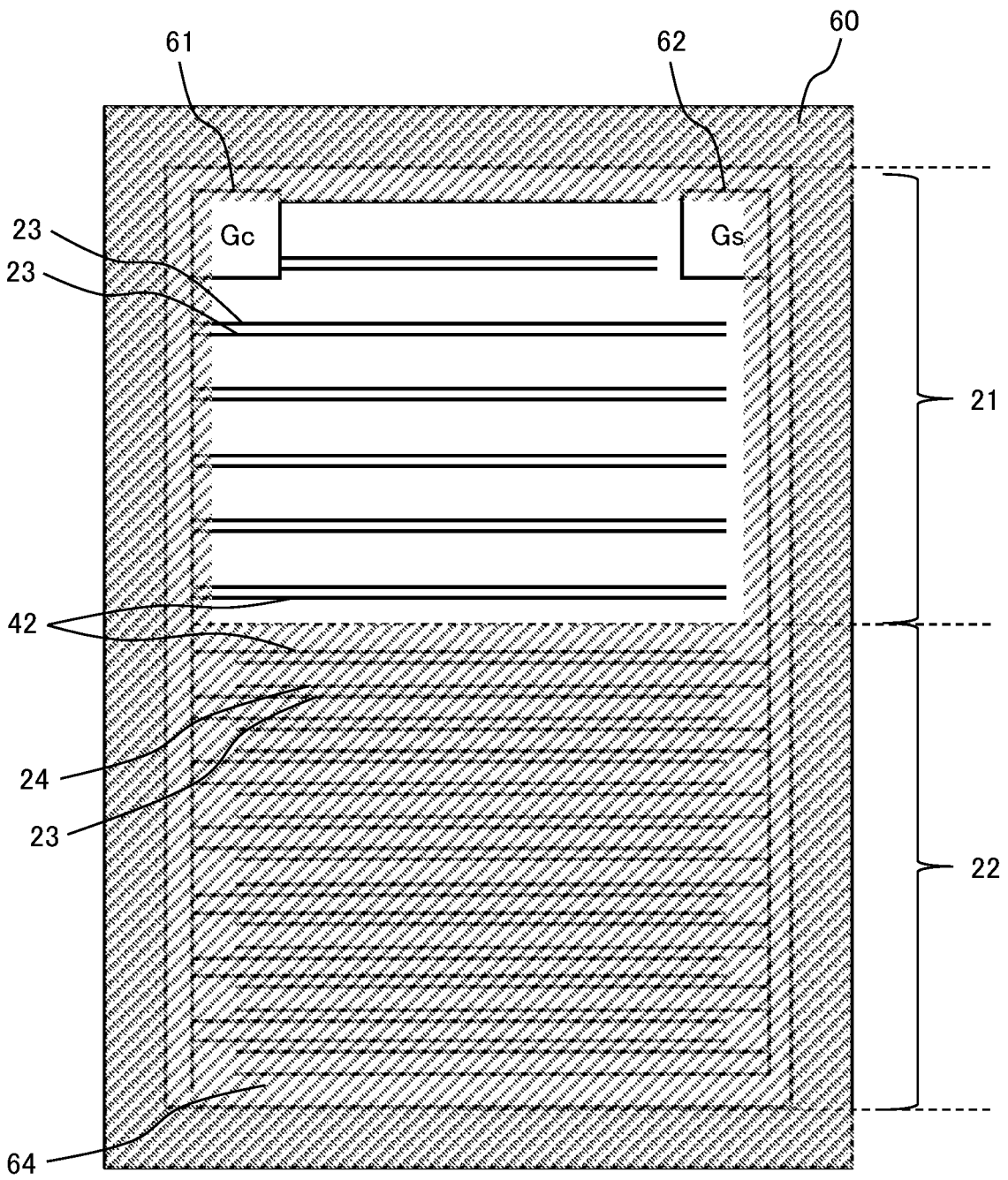
FIG. 10 is a planar layout view of the semiconductor device shown in FIG. 9.

FIG. 10 is a planar layout view of the semiconductor device 300 shown in FIG. 9.

The semiconductor device 300 of the present embodiment is, as shown in FIG. 10, constituted to have the high conduction region 21 and the low conduction region 22 placed inside a common field relaxing region 60 placed at the periphery of the chip and the carrier lifetime killer layer 64 is placed in the drift region in the low conduction region 22.

Here, also in the field relaxing region 60, the drift is shown as that having the carrier lifetime killer layer 63. Since the drift in the field relaxing region 60 does not require carrier accumulation and suppressing the concentration of carriers on the boundary with the high conduction region 21 or the low conduction region 22 at turn-off switching time leads to reliability improvement, the carrier lifetime killer layer 63 is placed as in the low conduction region 22.

A method of manufacturing the semiconductor device 300 of the present embodiment will be described referring to FIG. 11. The carrier lifetime killer layer 63 is required to be formed selectively in the n– type drift layer 20 in the low conduction region 22. This is achieved by subjecting a depth-adjusting mask 66 to patterning during light-ion irradiation 65.

Thickness 67 of the mask 66 that covers the low conduction region 22 therewith is adjusted to extend to a depth position where the carrier lifetime killer layer 63 remains in the n– type drift layer 20 while the mask in the high conduction region 21 is adjusted so that the carrier lifetime killer layer does not enter. In other words, the semiconductor device 300 of the present embodiment is manufactured by irradiating the whole surface of the chip with light ions through the stepped mask 66 obtained by patterning.

As a result, the high conduction region 21 and the low conduction region 22, and also the carrier control gate (Gc) 23 and the switching gate (Gs) 24 are placed inside one chip and low-loss performance and temperature uniformity which are the advantageous effects of the present invention can be achieved as in Embodiment 1.

By the semiconductor device 300 (double gate IGBT) of the present embodiment, therefore, low-loss performance that satisfies both a low conduction loss and a low turn-off loss and in-chip uniformity for a temperature rise caused by the power generated at conduction time and turn-off switching time can be achieved.

Modification Example of Embodiment 3

Figure 23:
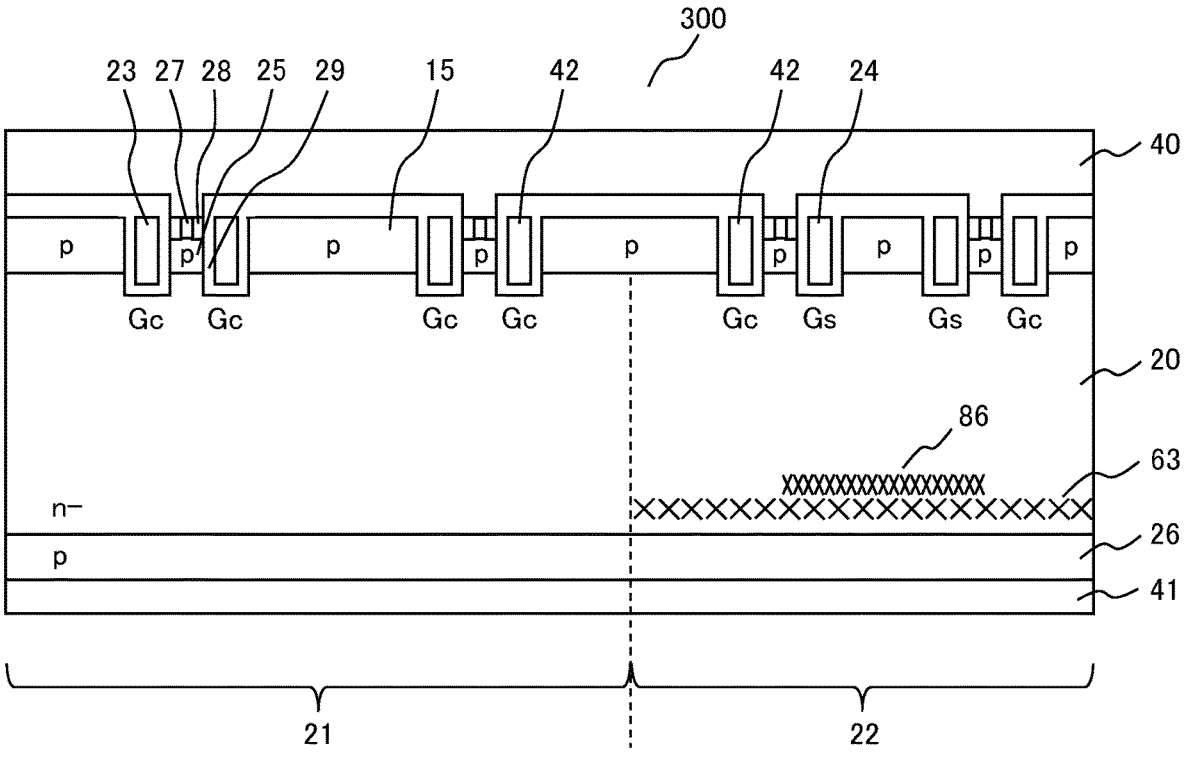
FIG. 23 is a view showing a modification example (Modification Example of Third Embodiment) of FIG. 9.

FIG. 23 shows a modification example of FIG. 9.

As shown in FIG. 23, in addition to the constitution shown in FIG. 9, a carrier lifetime killer layer 86 different from the carrier lifetime killer layer 63 may be added in the n– type drift layer 20 in a region of the low conduction region 22 where the switching gate (Gs) 24 is placed.

Thus, it is possible to enhance the advantageous effects of the present invention further by making the concentration of carriers, that can be accumulated at conduction time in the n– type drift layer 20 where the switching gate (Gs) 24 is placed, in the low conduction region 22, lower than the concentration of carriers that can be accumulated at conduction time in the n– type drift layer where the carrier control gates (Gc) 23 and 42 are placed in the low conduction region 22.

Figure 11:
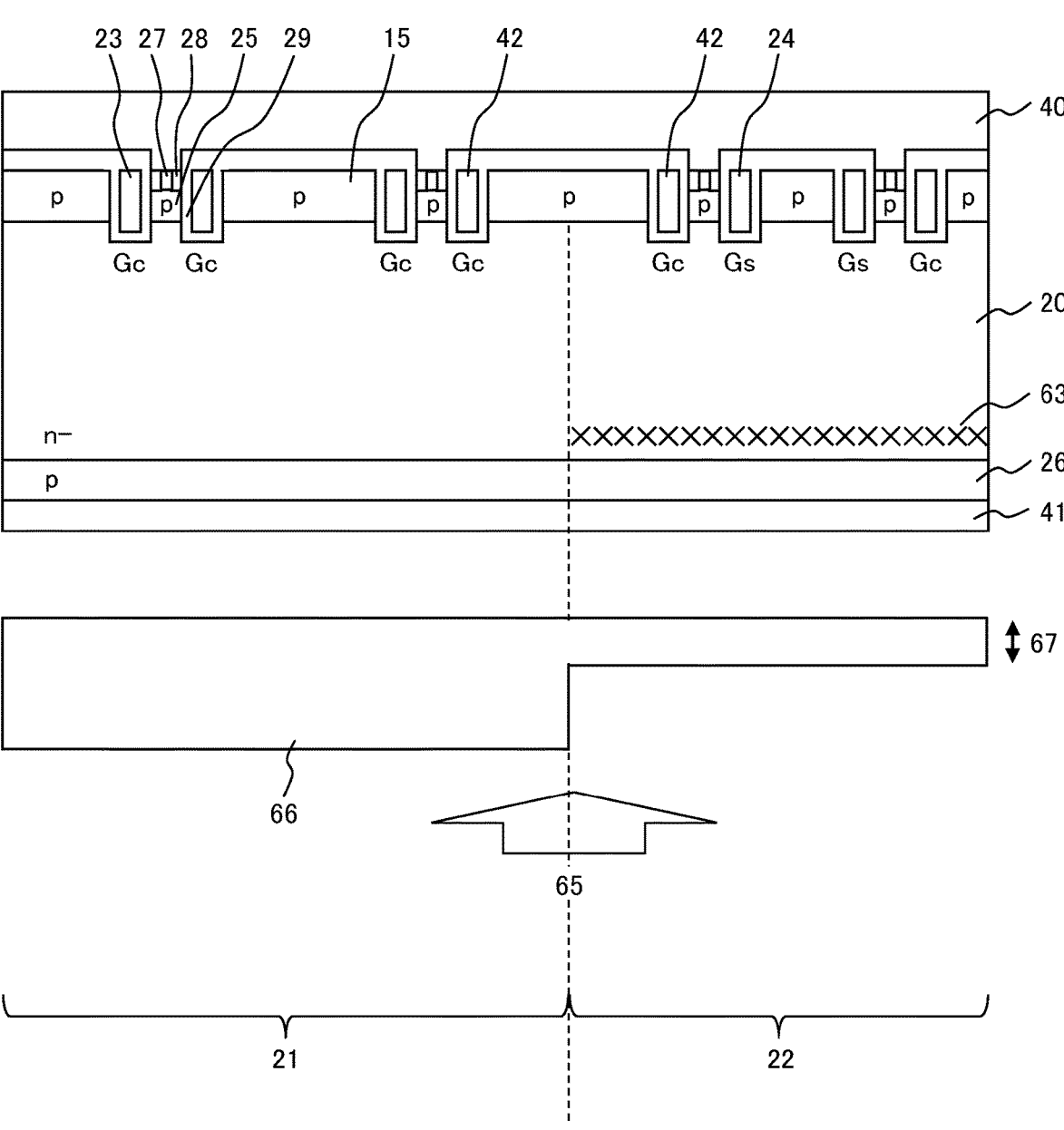
FIG. 11 is a view showing a method of manufacturing the semiconductor device shown in FIG. 9.
Figure 24A:
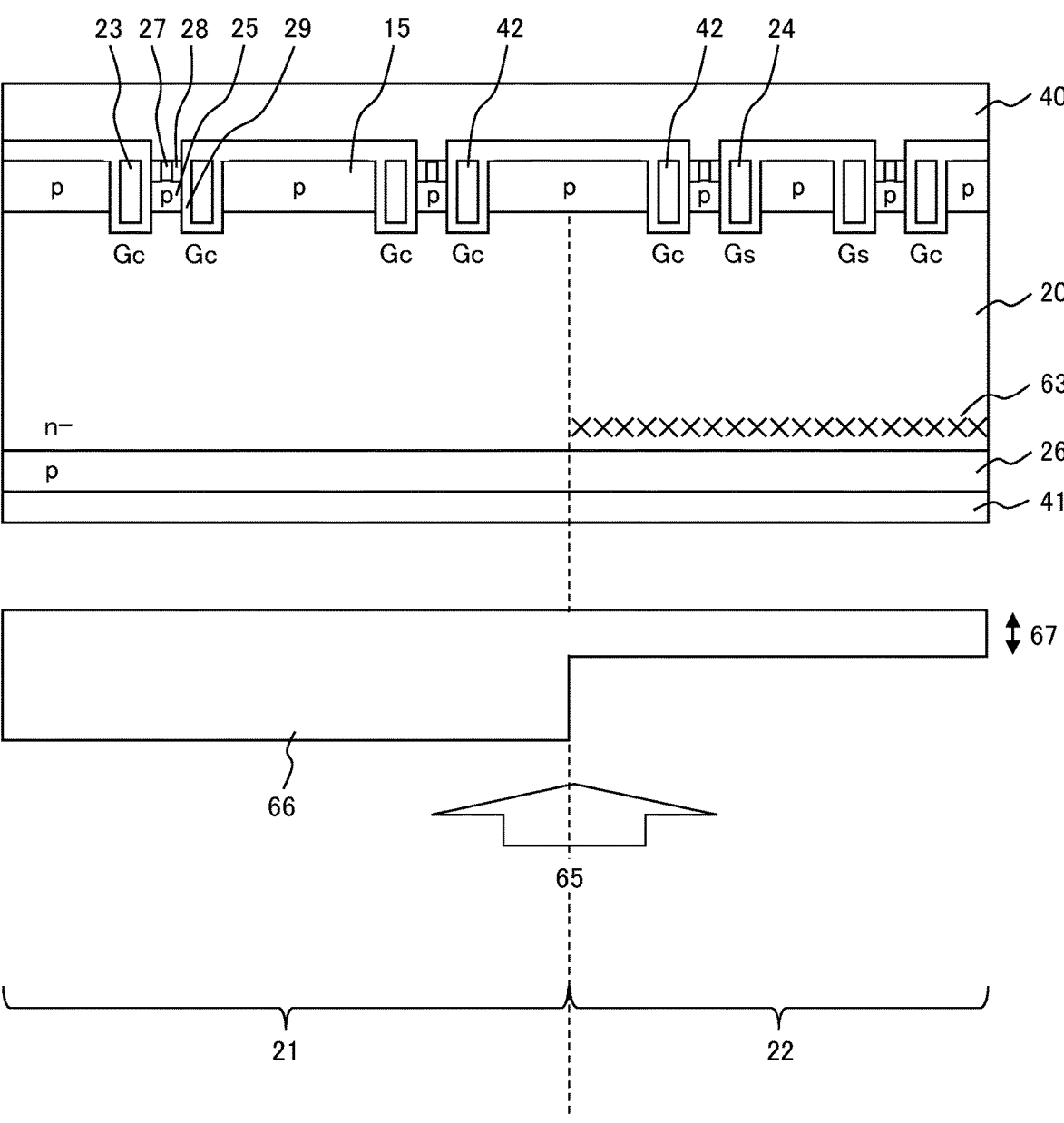
FIG. 24A is a view showing a method of manufacturing the semiconductor device shown in FIG. 23 (first irradiation step).
Figure 24B:
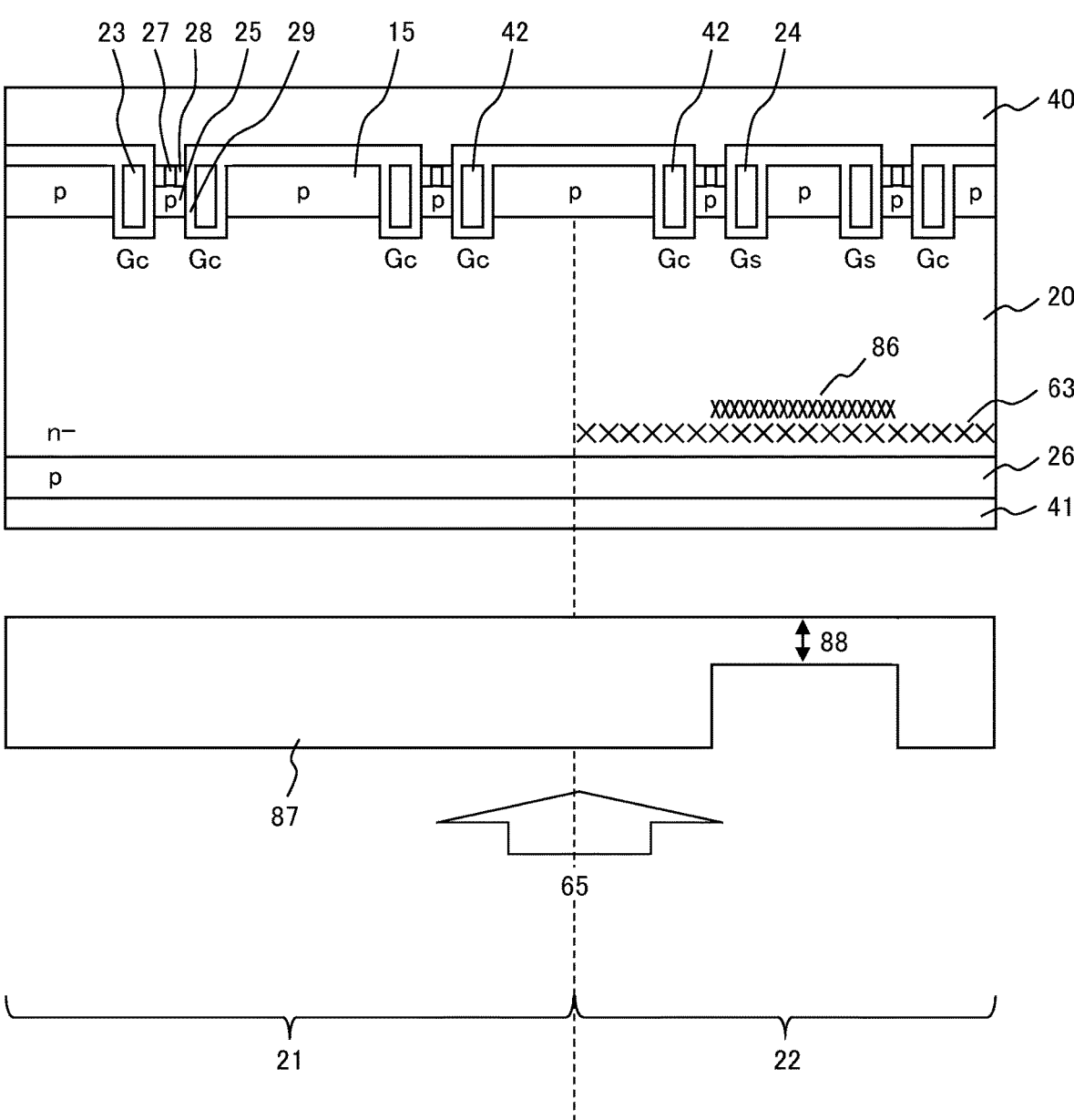
FIG. 24B is a view showing the method of manufacturing the semiconductor device shown in FIG. 23 (second irradiation step).

FIGS. 24A and 24B show a method of manufacturing the semiconductor device shown in FIG. 23 and they correspond to a modification example of FIG. 11.

The manufacturing method has two steps, that is, a first light-ion irradiation step (FIG. 24A) and a second light-ion irradiation step (FIG. 24B) as shown in FIGS. 24A and 24B. The first light-ion irradiation step shown in FIG. 24A is similar to that in FIG. 11 so that the same description is not repeated.

After forming the carrier lifetime killer layer 63 in the low conduction region 22 by the first light-ion irradiation step shown in FIG. 24A, a mask 87 which is different from the mask 66 and whose thickness 88 in a region of the low conduction region 22 facing the region where the switching gate (Gs) 24 is placed is thinner than that of the other region is placed on the back surface side of the chip. The mask 87 is then irradiated with light ions from the side thereof opposite to a surface facing with chip. In the above example, the first light-ion irradiation step is followed by the second light-ion irradiation step, but the second light-ion irradiation step may be followed by the first light-ion irradiation step.

Embodiment 4

Figure 12:
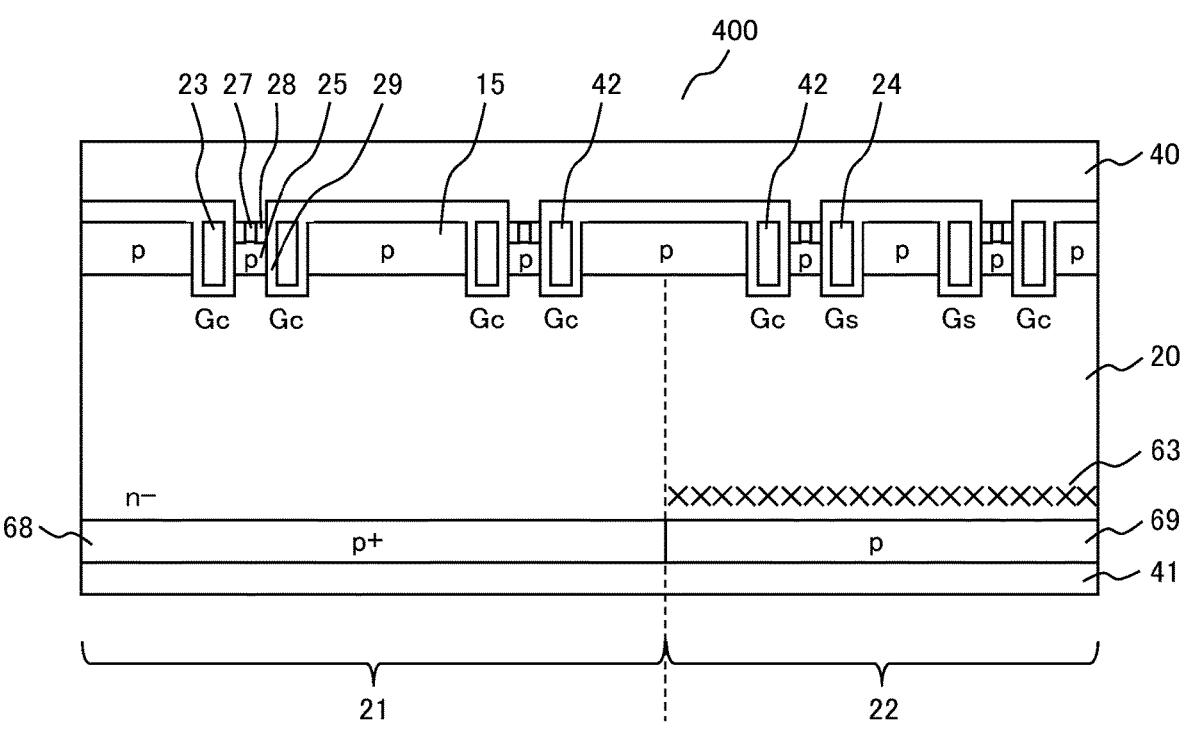
FIG. 12 is a cross-sectional view of a semiconductor device of Fourth Embodiment of the present invention.

An insulated gate (gate controlled) semiconductor device of Embodiment 4 of the present invention will be described referring to FIGS. 12 and 13. FIG. 12 is a cross-sectional view of a semiconductor device 400 of this embodiment of the present invention.

The semiconductor device 400 of the present embodiment is a double gate IGBT having a plurality of trench gate shapes and has a high conduction region 21 and a low conduction region 22 placed in a common n– type drift layer 20. The high conduction region 21 is a region where high-concentration carriers can be accumulated at the IGBT conduction time, while the low conduction region 22 is a region where carriers with a concentration lower than that in the high conduction region 21 can be accumulated at the IGBT conduction time.

The present embodiment provides a carrier lifetime killer layer 63 in an n– type drift layer 10 in the low conduction region 22 with a view to enhancing the concentration of carriers that can be accumulated during a high conduction term 46 at conduction time and reducing the concentration of carriers that can be accumulated in the low conduction region 22 during a low conduction term 47, in other words, for achieving high controllability of the accumulated carrier concentration by the bias of carrier control gates (Gc) 23 and 42.

Further, the impurity concentration of a p type collector layer 68 in the high conduction region 21 is made different from the impurity concentration of a p type collector layer 69 in the low conduction region 22 and the impurity concentration of the p type collector layer 68 in the high conduction region 21 is set higher than the impurity concentration of the p type collector layer 69 in the low conduction region 22.

This makes it possible to enhance the injection efficiency of holes 52 from the high-concentration p type collector layer 68 in the high conduction region 21 during the high conduction term 46 at conduction time and at the same time, reduce the injection efficiency of the holes 52 from the low-concentration p type collector layer 69 in the low conduction region 22 during the low conduction term 47, in other words, to enhance the controllability of the accumulated carrier concentration further.

Certain advantageous effects of the present invention can be obtained without the carrier lifetime killer layer 63, but high advantageous effects can be obtained by using it in combination with a difference in impurity concentration of the p type collector layer between the high conduction region 21 and the low conduction region 22.

By differentiating the impurity concentration of the p type collector layer between the high conduction region 21 and the low conduction region 22 and placing, of the carrier control gate (Gc) 42 and the switching gate (Gs) 24, the carrier control gate (Gc) 42 at the end portion of the low conduction region 22 on the boundary side with the high conduction region 21, the advantageous effects of the present invention, that is, low-loss performance and temperature uniformity can be achieved as in Embodiment 1.

Figure 13:
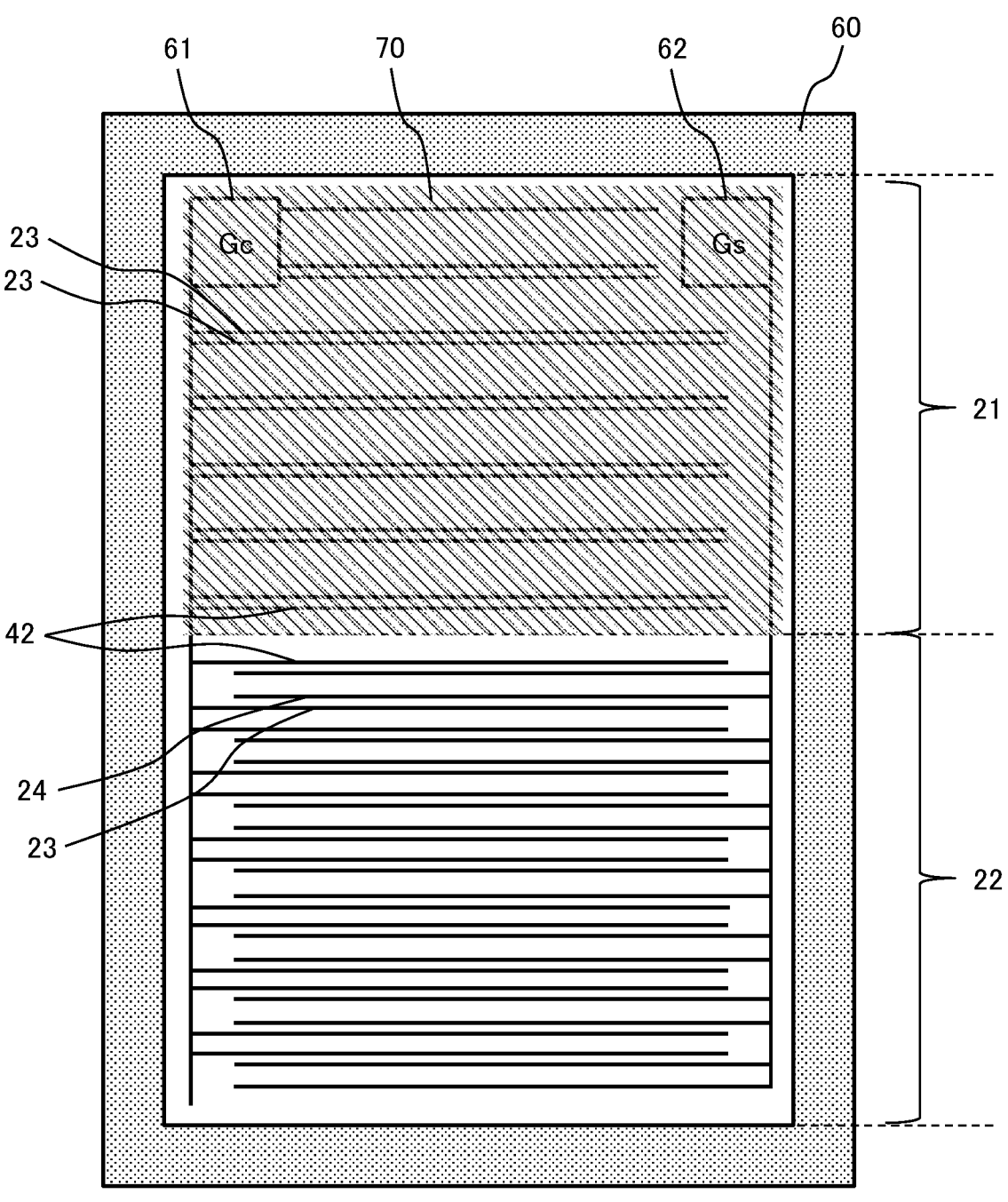
FIG. 13 is a planar layout view of the semiconductor device shown in FIG. 12.

FIG. 13 is a planar layout view of the semiconductor device 400 shown in FIG. 12.

The semiconductor device 400 of the present embodiment is, as shown in FIG. 13, constituted to have the high conduction region 21 and the low conduction region 22 inside a common field relaxing region 60 placed at the periphery of the chip and have, below a drift layer in the high conduction region 21, a region 70 where the high-concentration p type collector layer 68 is placed.

Here, the drift in the field relaxing region 60 does not require carrier accumulation. Since suppressing carrier concentration to the boundary with the high conduction region 21 or the low conduction region 22 at turn-off switching time leads to reliability improvement, the low-concentration p type collector layer 69 is placed as in the low conduction region 22.

Thus, by the semiconductor device 400 (double gate IGBT) of the present embodiment, low-loss performance that simultaneously satisfies a low-conduction loss and a low turn-off loss and in-chip uniformity for a temperature rise caused by the power generated at conduction time and turn-off switching time can be achieved.

Embodiment 5

Figure 14:
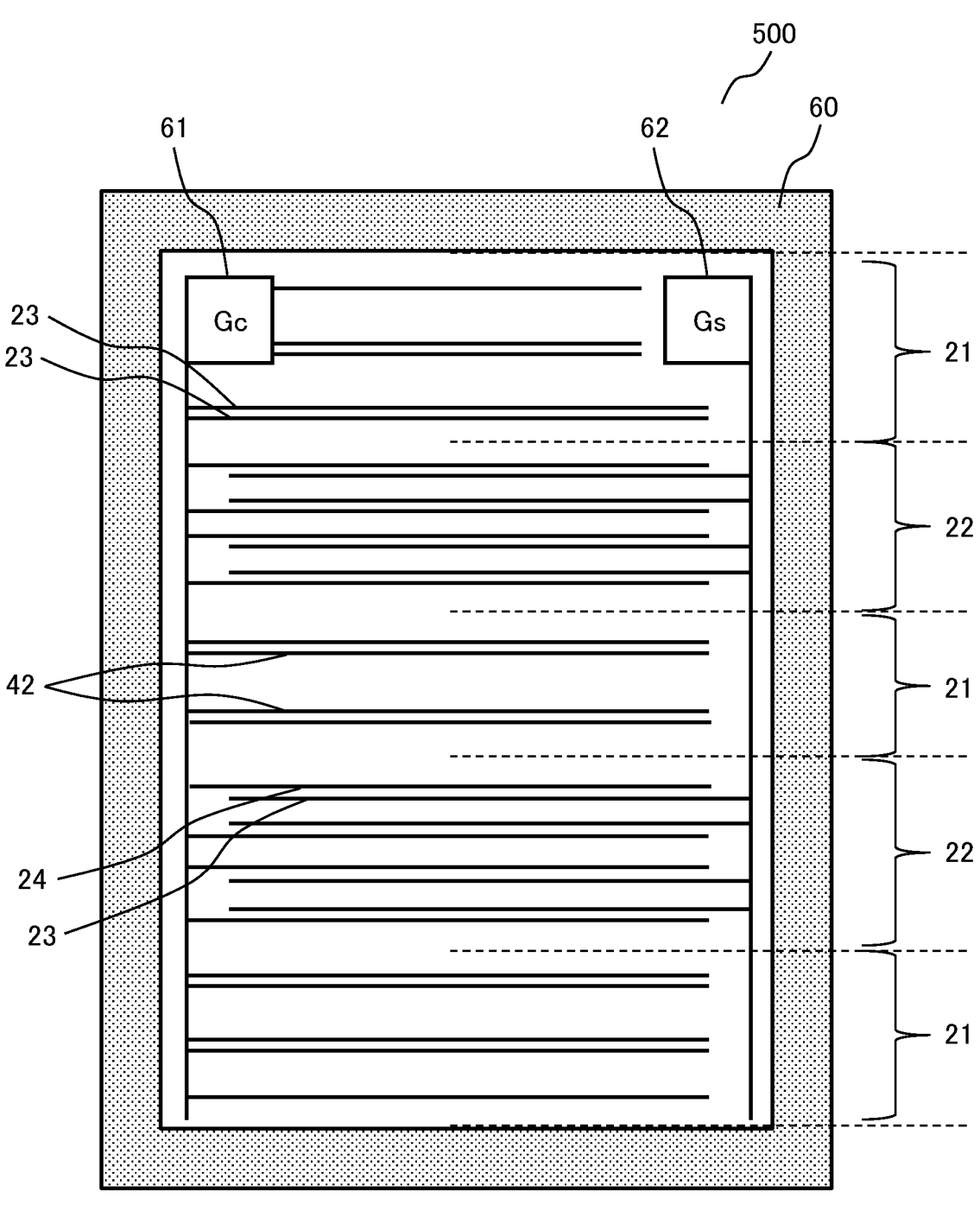
FIG. 14 is a planar layout view of a semiconductor device of Fifth Embodiment of the present invention.

An insulated gate (gate controlled) semiconductor device of Embodiment 5 of the present invention will be described referring to FIGS. 14 to 17. FIG. 14 is a planar layout view of a semiconductor device 500 of the present embodiment.

The semiconductor device 500 of the present embodiment is a double gate IGBT having a plurality of trench gate shapes and has a plurality of high conduction regions 21 and a plurality of low conduction regions 22 placed in one chip. The high conduction region 21 is a region where high-concentration carriers can be accumulated at the IGBT conduction time, while the low conduction region 22 is a region where carriers with a concentration lower than that in the high conduction region 21 can be accumulated at the IGBT conduction time.

A field relaxing region 60 placed at the periphery of the chip has therein both the plurality of high conduction regions 21 and the plurality of low conduction regions 22.

Here, selective formation of the carrier lifetime killer layer 63 as described in Embodiment 3 may be introduced for the high conduction region 21 and the low conduction region 22 or the concentration of the p type collector layer may be changed as described in Embodiment 4. This contributes to the further enhancement of the advantageous effects of the present invention.

The plurality of the high conduction regions 21 and the plurality of the low conduction regions 22 are adjacent to each other and are constituted inside the common field relaxing region 60. At the IGBT conduction time and turn-off switching operation time, such a constitution is highly effective for diffusing the heat generated due to the growing generated power in one of the regions to the other region and therefore can enhance the in-chip temperature uniformity. In addition, this effect can be enhanced further by dividing each of the high conduction region 21 and the low conduction region 22 and thereby increasing their number.

The effect of temperature uniformity can be enhanced further not only by dividing the regions in a perpendicular direction (long-side direction of the semiconductor device 500) to increase their number but also dividing them in a horizontal direction (short-side direction of the semiconductor device 500) to place them in a zigzag manner.

A plurality of carrier control gates (Gc) 23 and a plurality of switching gates (Gs) 24 are connected respectively to a pad electrode 61 of the carrier control gate (Gc) and a pad electrode 62 of the switching gate (Gs) which are each placed one in the chip to enable application of a control bias thereto from the outside.

It is to be noted that the carrier control gate (Gc) 23 and the switching gate (Gs) 24 are wired with, for example, polysilicon embedded under the emitter electrode 40.

In particular, in the case of the division in a horizontal direction (short-side direction of the semiconductor device 500), a wiring layer composed of two layers may be used in order to form wiring of the carrier control gate (Gc) 23 and the switching gate (Gs) 24 efficiently with the shortest distance.

Of the carrier control gate (Gc) 42 and the switching gate (Gs) 24, the carrier control gate (Gc) 42 is placed at the end portion of the low conduction region 22 on the boundary side with the high conduction region 21. Similar to Embodiment 1, this makes it possible to bring about the advantageous effects of the present invention, that is, low-loss performance and temperature uniformity.

Modification Example 1 of Embodiment 5

Figure 15:
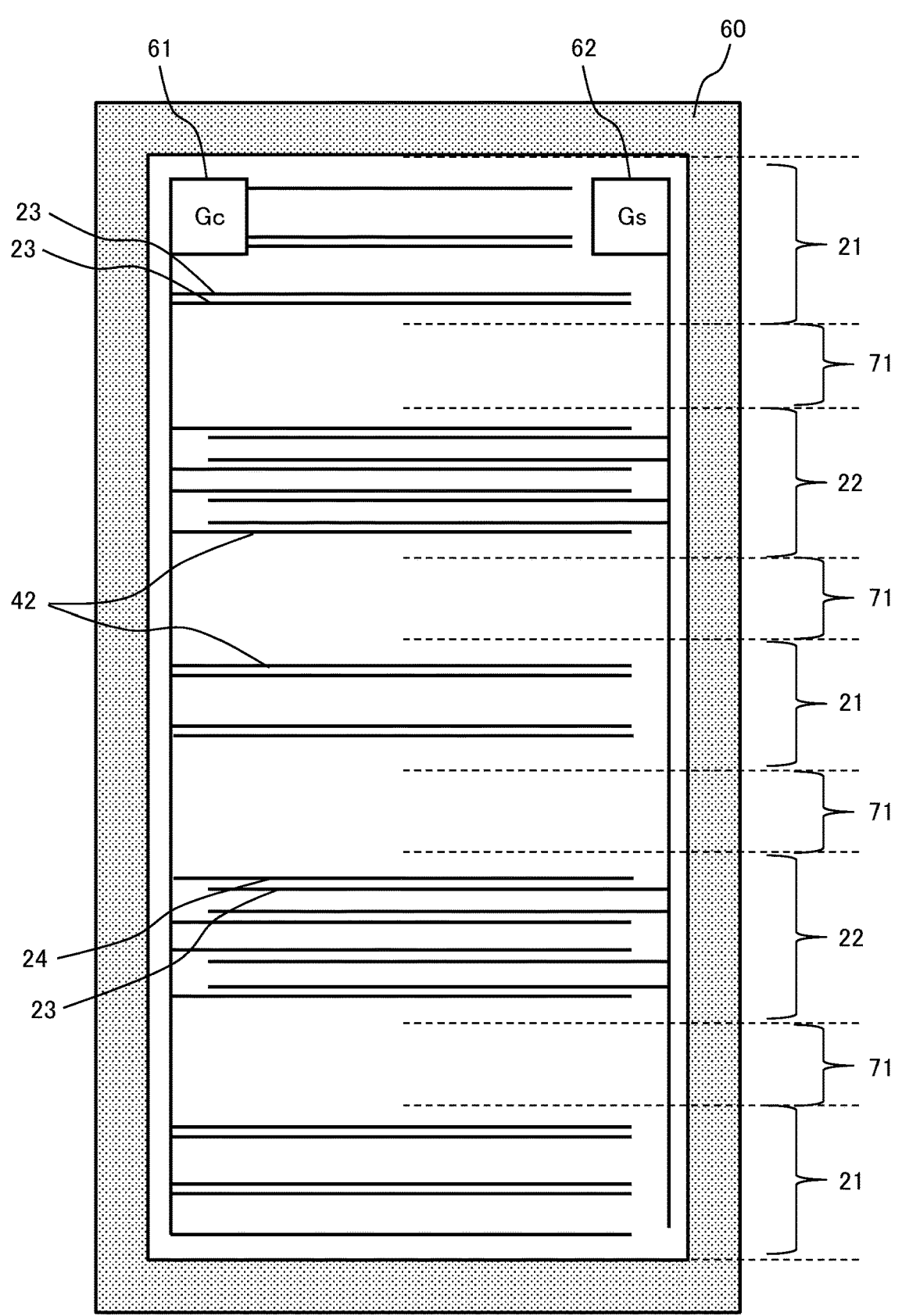
FIG. 15 is a view showing a modification example (Modification Example 1 of Fifth Embodiment) of FIG. 14.

FIG. 15 is a planar layout view showing a modification example of FIG. 14.

The embodiments described above show an example of placing the high conduction region 21 and the low conduction region 22 directly adjacent to each other.

Figure 20:
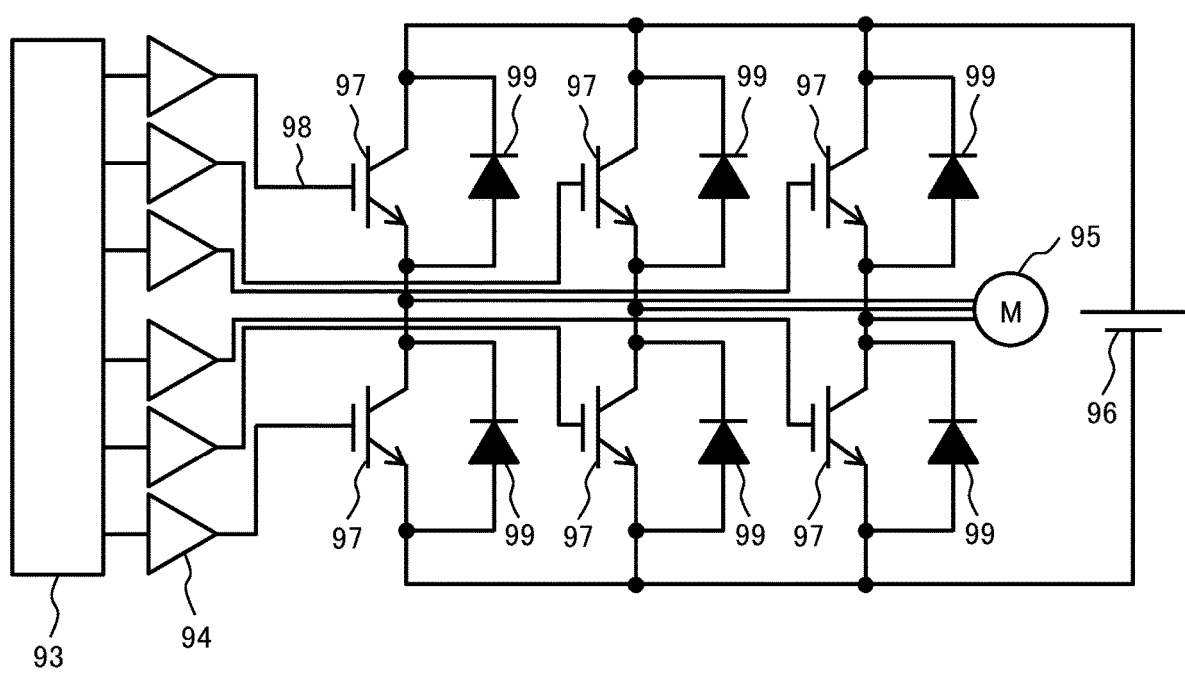
FIG. 20 is a view showing a circuit structure of a representative power conversion device.
Figure 21:
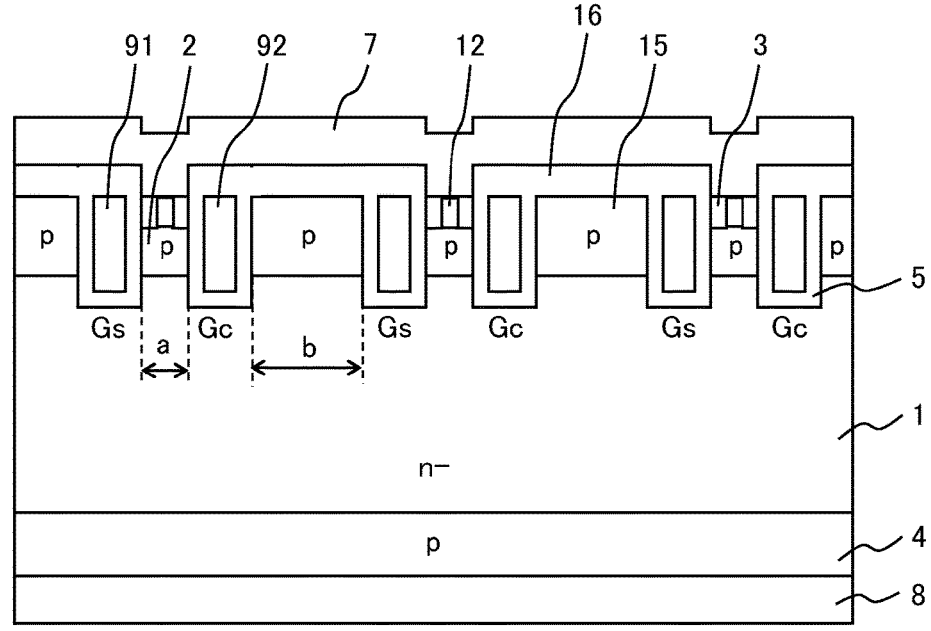
FIG. 21 is a cross-sectional view of a semiconductor device to which a conventional technology described in Patent Literature 1 was applied.
Figure 22:
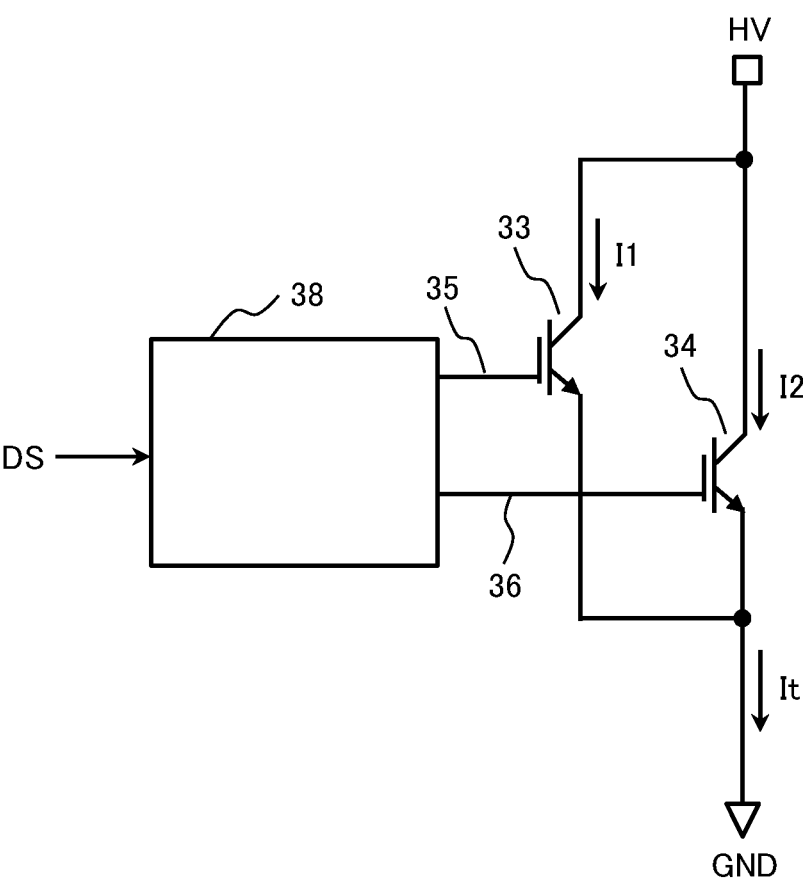
FIG. 22 is a circuit view of a semiconductor device to which a conventional technology described in Patent Literature 2 was applied.

Provided in the present modification example is a double gate IGBT having a plurality of trench gate shapes and constituted to have a plurality of high conduction regions 21 and a plurality of low conduction regions 22 in one chip. Further, it has a diode region 71 at the boundary between the high conduction region 21 and the low conduction region 22. In a power conversion device, it is necessary and indispensable to connect the diode to the IGBT in reversely parallel to each other for the purpose of reflux/rectification as shown in FIG. 20.

The present modification example has such a constitution that the diode is incorporated in the chip of the double gate IGBT. Placing the diode region 71 between the high conduction region 21 and the low conduction region 22 is effective for diffusing, at the IGBT conduction time and the turn-off switching operation time, the heat generated due to the growing generated power in one of the regions to the diode region 71 having the common n– type drift layer 20, making it possible to enhance the in-chip temperature uniformity.

In addition, the present modification example is effective for diffusing the generated heat, which is due to power generated by the conduction operation and the switching operation in the diode region 71, to the high conduction region 21 and the low conduction region 22 of the IGBT composed of the common n– type drift layer 20 so that compared with the constitution using the diode as a separate chip, the temperature uniformity of the IGBT and the diode can be enhanced further and a temperature rise can be suppressed. At the same time, it is also possible to eliminate the field relaxing region 60 from the diode region 71 and correspondingly increase the areas of the IGBT region and the diode region to further enhance a rated capacity increasing effect.

In the constitution shown in FIG. 15, a plurality of the diode regions 71 are placed between a plurality of the high conduction regions 21 and the low conduction regions 22. Certain advantageous effects of the present invention are exhibited even when this constitution can be applied to Embodiment 1 to Embodiment 4 and the number of the respective regions is reduced to one.

Even when for example, in the constitution as shown in Embodiment 1 (FIG. 1) having one high conduction region 21 and one low conduction region 22, the diode region 71 is placed between the high conduction region 21 and the low conduction region 22, it is possible to achieve the advantageous effects of the present invention, that is, low-loss performance and temperature uniformity as in Embodiment 1 by placing, of the carrier control gate (Gc) 42 and the switching gate (Gs) 24, the carrier control gate (Gc) 42 at the end portion of the low conduction region 22 on the boundary side with the high conduction region 21 having the diode region 71 therebetween.

Figure 16:
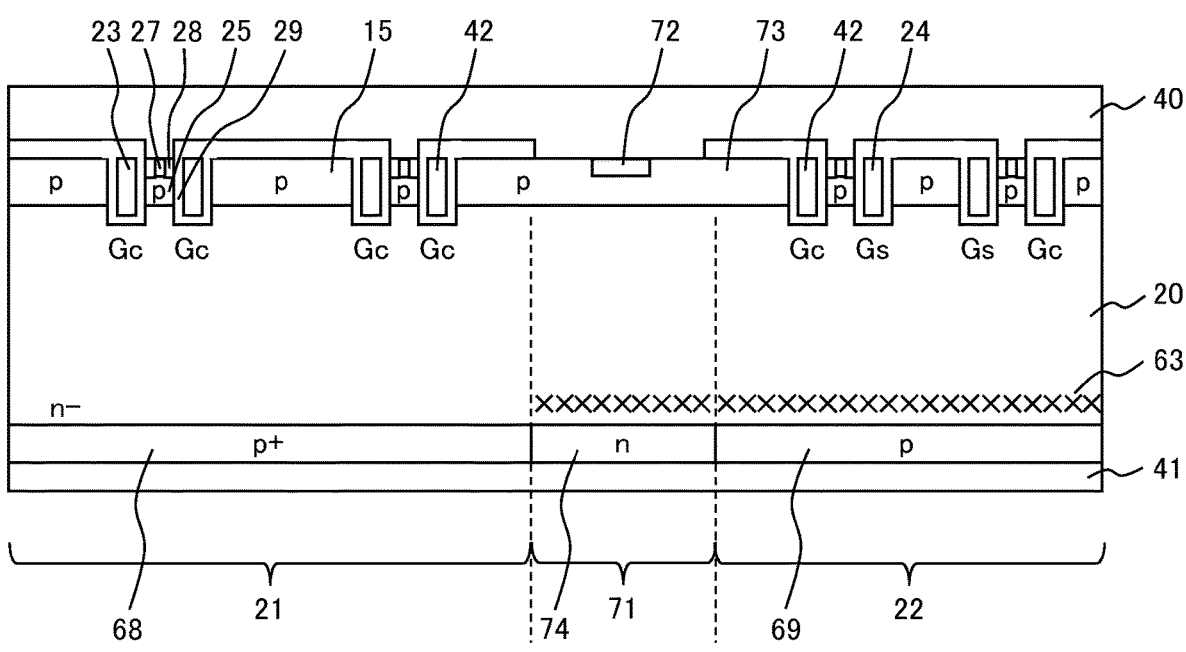
FIG. 16 includes a cross-sectional view and an equivalent circuit view of the semiconductor device shown in FIG. 15.
Figure 16:
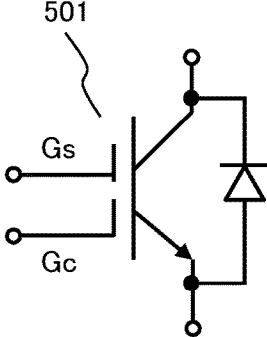

FIG. 16 shows a cross-section and an equivalent circuit of the semiconductor device shown in FIG. 15.

The high conduction region 21, the diode region 71, and the low conduction region 22 are formed from the common n– type drift layer 20 and thermal resistance among these regions is extremely small. The anode electrode of the diode region 71 can be used common with the emitter electrode 40 of the high conduction region 21 and the low conduction region 22, and the cathode region of the diode region 71 can be used common with the collector electrode 41 of the high conduction region 21 and the low conduction region 22. This enables reflux/rectification operation necessary for predetermined power conversion.

The n– type drift layer 20 of the diode region 71 has thereabove an anode well region 73 and an anode power-feed region 72 which is in contact therewith. They are formed in the manufacturing step same as that of the n type emitter layer 28 of the high conduction region 21 and the low conduction region 22 of the double gate IGBT of the present invention.

The n– type drift layer 20 of the diode region 71 has therebelow an n type cathode layer 74. It is formed by using an impurity different from that injected into the p type collector layers 68 and 69 of the high conduction region 21 and the low conduction region 22.

A layer which is the same as the carrier lifetime killer layer 63 provided in the n– type drift layer 20 of the low conduction region 22 may be provided in the n– type drift layer 20 of the diode region 71. This contributes to a recovery switching loss reduction effect in the diode operation.

The high conduction region 21, the diode region 71, and the low conduction region 22 are formed from the common n– type drift layer 20. The thermal resistance among these regions is extremely small so that the aforesaid thermal diffusion effect is exhibited.

Of the carrier control gate (Gc) 42 and the switching gate (Gs) 24, the carrier control gate (Gc) 42 is placed at the end portion of the low conduction region 22 on the boundary side with the high conduction region 21 with the diode region 71 therebetween. As a result, the advantageous effects of the present invention, that is, low-loss performance and temperature uniformity can be achieved as in Embodiment 1.

Modification Example 2 of Embodiment 5

Figure 17:
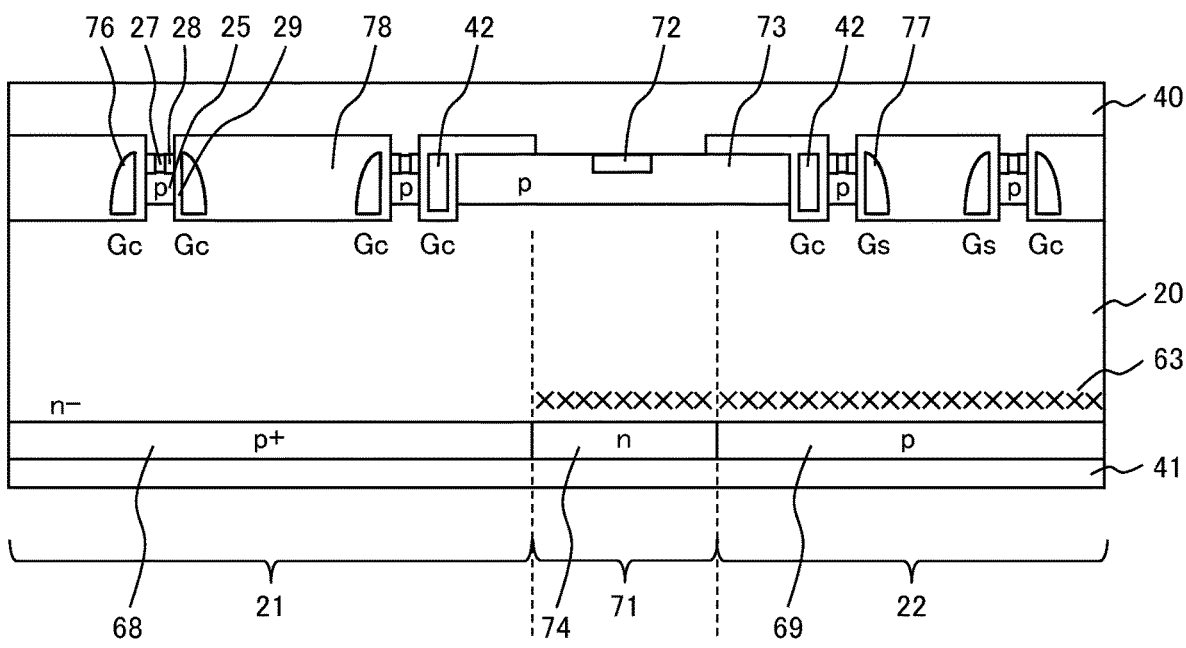
FIG. 17 is a view showing a modification example (Modification Example 2 of Fifth Embodiment) of FIG. 16.

FIG. 17 is a view showing a modification example of FIG. 16.

In the present modification example, the gate electrode has a side gate shape characterized by that one of the surfaces of the gate electrode is in contact with a p type well layer (emitter well layer) via a gate insulating film 29 and the other surface is in contact with an insulating film (thick oxide film 78) without the p type well layer (emitter well layer) and the n– type drift layer 20.

In the trench gate shape shown in First to Embodiment 4s, the MOS capacitance formed by the gate electrode, the gate insulating film 29, and the n– type drift layer 20 below the trench gate, and the MOS capacitance formed by a p type floating layer 15 (an n– type drift layer when the n-type drift layer is formed instead of the p type floating layer 15) placed on the surface opposite to a surface facing the p type well layer 25, the gate insulating film 29 and the gate electrode are placed in parallel to each other. In the trench gate type, therefore, the MOS capacitance thereof acts as a feedback capacitance and its value is large so that at the time of turn-off or turn-on switching of the IGBT, a mirror term for charging this capacitance occurs and it becomes a cause for preventing a high-speed change in current/voltage and increasing in loss.

In the side gate shape of the present modification example, on the other hand, a thick insulating film 78 is placed on the surface (meaning the other surface) opposite to the surface facing the p type well layer 25 and there is no capacitance component. The feedback capacitance is formed only by the MOS capacitance formed by the gate electrode, the gate insulating film 29, and the n– type drift layer 20 below the side gate, and the capacitance value of it is small relative to the trench gate type.

Compared with the trench gate type, the current/voltage changes more speedily at the time of switching, leading to a decrease in switching loss. By applying a side gate to the present invention, therefore, the advantageous effects of the present invention, that is, low loss performance and temperature uniformity can be enhanced as in Embodiment 1.

The side gate may have a rectangular cross-section similar to a conventional trench gate. Alternatively, as shown in FIG. 17, it may have a shape wider from the emitter electrode 40 side to the collector electrode 41 side.

In the present modification example, the high conduction region 21 and low conduction region 22, each having a side gate, have therebetween the diode region 71 but the diode region 71 is not essential. The side gate structure may be applied to Embodiment 1 to Embodiment 5 having no diode region 71 therein. When they are used in combination with the diode region 71, the advantageous effects of the present invention can be enhanced further due to the mix-loading effect of the aforesaid diode.

According to the constitution of the semiconductor device 500 (double gate IGBT) of the present embodiment and the modification examples thereof, low-loss performance satisfying both a low conduction loss and a low turn-off loss and in-chip uniformity against a temperature rise caused by the power generated at conduction time and turn-off switching time can be achieved.

Embodiment 6

Figure 18:
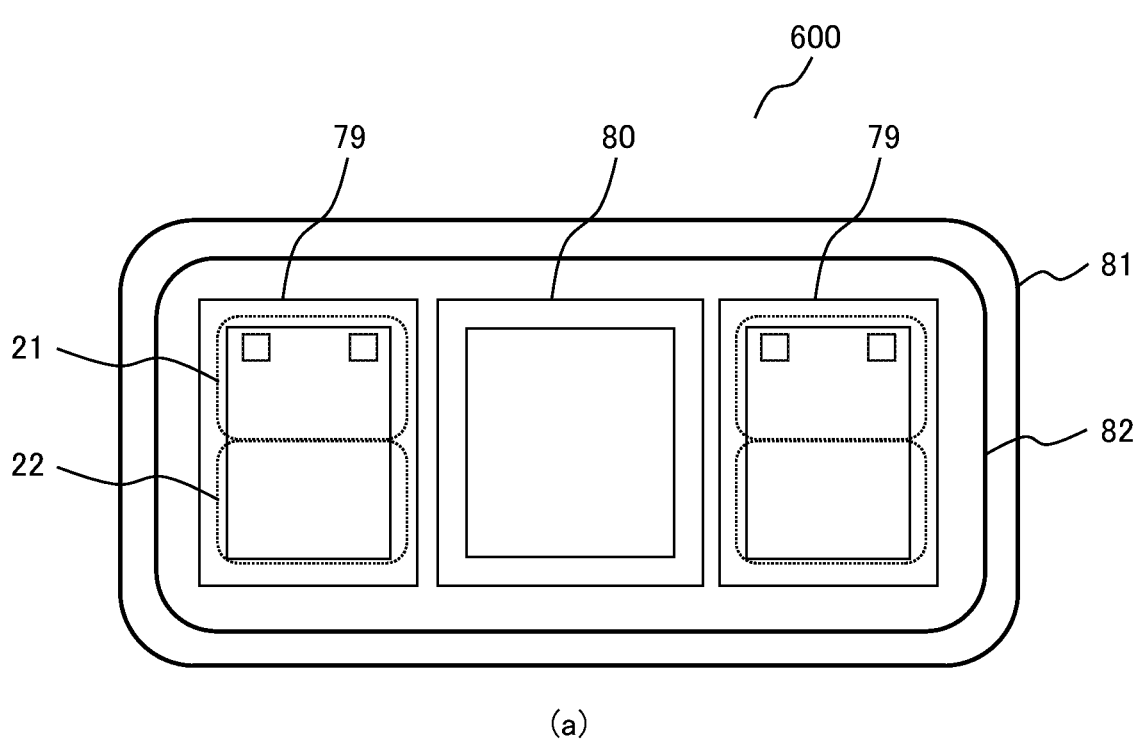
FIG. 18 is a planar arrangement view and a cross-sectional arrangement view of a semiconductor device of Sixth Embodiment of the present invention.
Figure 18:
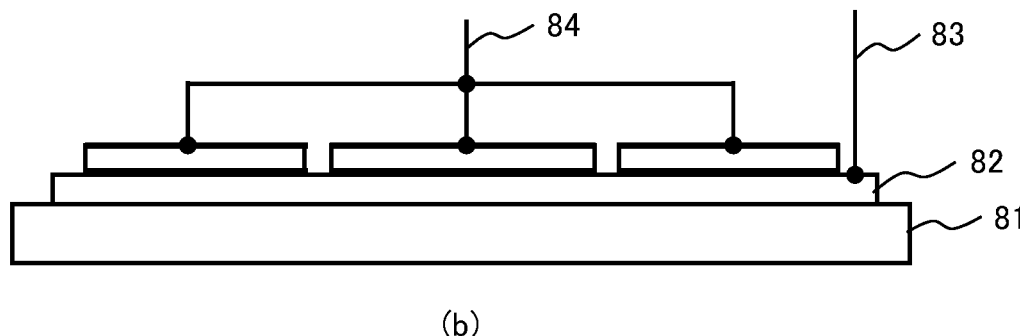
Figure 19:
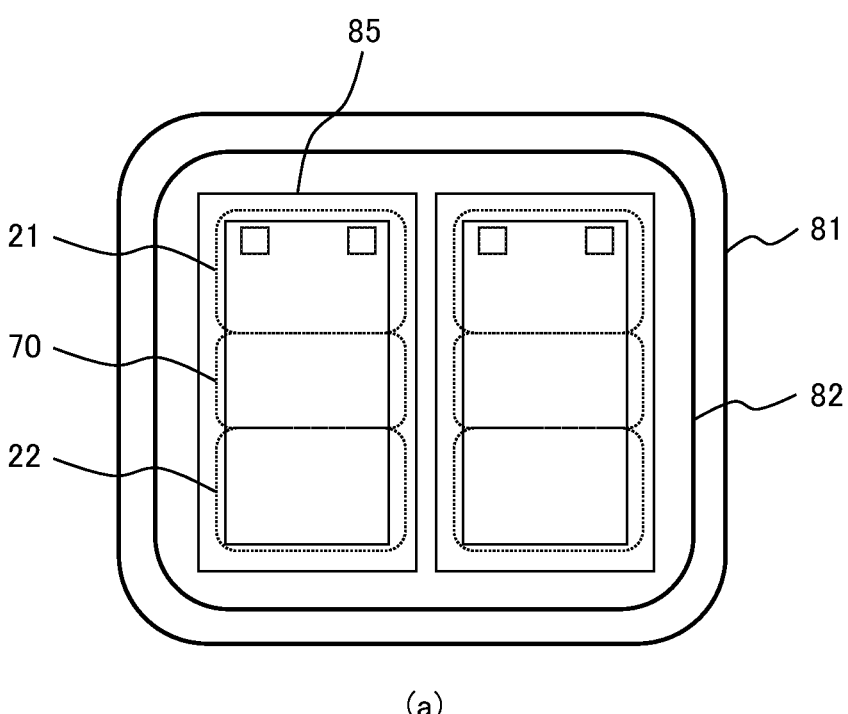
FIG. 19 is a view showing a modification example (Modification Example of Example 6) of FIG. 18.
Figure 19:
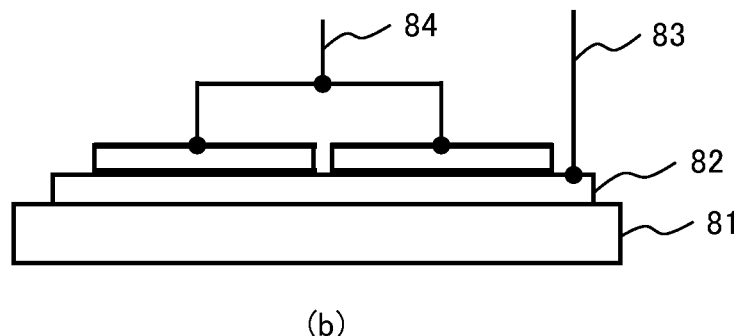

Referring to FIGS. 18 and 19, an insulated gate (gate controlled) semiconductor device of Embodiment 6 of the present invention will be described. FIGS. 18(*a*) and (*b*) are a planar arrangement view and a cross-sectional arrangement view of a semiconductor device 600 of the present embodiment, respectively.

The semiconductor device 600 of the present embodiment has a constitution with a chip 79 of an IGBT element having therein a high conduction region 21 and a low conduction region 22 and a chip 80 of a diode element, the chips being connected reversely parallel to each other.

The IGBT element has a constitution assumed not to have the diode region 71 and the constitution is as described in Embodiment 1 to Embodiment 5 (except Modification Examples 1 and 2 of Embodiment 5) so that the description on the constitution is omitted here. In the present embodiment, the diode chip 80 serving as a rectification element is connected reversely parallel to the double gate IGBT chip 79.

The aforesaid constitution allows current to flow from an IGBT collector terminal to emitter terminal via the diode chip 80, and realizes the function of a power conversion device including an inverter.

The diode chip 80 is connected in reversely parallel relation by electrically connecting a cathode terminal and an anode terminal thereof not shown in the views to the collector terminal and the emitter terminal of the double gate IGBT chip 79, respectively.

Here, the diode chip 80 may be either a diode having a PN junction formed by doping of an impurity into an Si substrate or SiC substrate or a diode having a Schottky barrier junction between an impurity-doped layer and a metal. The diode may be either one element or a plurality of small elements loaded in parallel to each other.

The double gate IGBT chip 79 and the diode chip 80 are joined with a conductive film 82 formed on the same insulating substrate 81 and loaded on this insulating substrate 81. They are joined with a solder material or the like.

Here, the collector electrode of the double gate IGBT chip 79 is electrically connected to the cathode electrode of the diode chip 80 via the conductive film 82 on the insulating substrate 81. By a terminal 83 conductive to the conductive film 82, an electrical signal is introduced into the double gate IGBT chip 79 and the diode chip 80.

The emitter electrode of the double gate IGBT chip 79 and the anode electrode of the diode chip 80 can give an electrical signal to the double gate IGBT chip 79 and the diode chip 80 via a terminal 84 electrically connected to both of them.

These terminals 83 and 84 are each a conductive wire using, for example, aluminum or copper as a material. That is, two IGBT elements and the diode element are connected reversely parallel to each other by the insulating substrate 81 having a metal film (conductive film 82) formed thereon and the wires, and become a semiconductor part to which a current can bidirectionally be applied.

Here, by the constitution that sandwiches the diode chip 80 between the two double gate IGBT chips 79, power-derived heat generated by the operation of the individual elements can be released to the other element and therefore a temperature rise can be suppressed.

At conduction time, the double gate IGBT chip 79 generates power due to a current flowing therethrough and a voltage drop at this time and generates heat by thermal resistance around the element. At turn-off or turn-on switching time, on the other hand, it generates power due to a transitional change in current or voltage and similarly generates heat by thermal resistance around the element.

It is important to suppress this heat generation because a temperature increase of the element can be suppressed to enable a larger current to flow and in addition, long-term reliability is improved. By sandwiching the diode chip 80 between the two double gate IGBT chips 79, heat can be diffused to this diode chip 80 when the double gate IGBT chips 79 generate heat, leading to an increase in heat capacity.

The temperature rise at the operation time of the double gate IGBT chips 79 can therefore be suppressed so that the advantageous effects of the present invention can be enhanced further.

Modification Example of Embodiment 6

FIG. 19 is a modification example of FIG. 18.

The present modification example uses a chip 85 on which the double gate IGBT and the diode described in Modification Examples 1 and 2 of Embodiment 5 are mix-loaded.

Although heat is generated in one chip by the operation of the IGBT region and the diode region, the temperature uniformity of them can be maintained by the thermal diffusion effect in the chip. For the purpose of adjusting a rated capacity, therefore, it is possible to maintain the temperature uniformity in the regions and capacity can be increased by connecting the chips 85 in parallel to each other as shown in FIG. 19.

As described above, the double gate IGBT of the present invention achieves both low-loss performance satisfying a low conduction loss and a low turn-off loss and in-chip uniformity against a temperature rise caused by the power generated at conduction time and turn-off switching time and further, by using it in combination with the diode reversely connected in parallel, a power conversion device comprised of IGBT and the diode and capable of maintaining reliability and handling a required capacity easily can be provided.

The present invention can be applied to a semiconductor device, a drive device for a semiconductor circuit, and a power conversion device suited for use widely for low power devices such as air conditioner and microwave oven and high power devices such as automobiles, railways, and inverters of an iron mill.

It should be noted that the present invention is not limited to the examples described above, and includes various modification examples. For example, the examples described above have been described in detail to simply describe the present invention, and are not necessarily required to include all the described configurations. In addition, part of the configuration of one example can be replaced with the configurations of other examples, and in addition, the configuration of the one example can also be added with the configurations of other examples. In addition, part of the configuration of each of the examples can be subjected to addition, deletion, and replacement with respect to other configurations.

REFERENCE SIGNS LIST

1: n– type drift layer, 2: p type well layer, 3: n type emitter layer, 4: p type collector layer, 5: gate insulating film (oxide film), 7: emitter electrode, 8: collector electrode, 12: p type power-feed layer, 15: p type floating layer or n– type drift layer, 16: thick insulating film, 20: n– type drift layer, 21: high conduction region, 22: low conduction region, 23: carrier control gate (Gc), 24: switching gate (Gs), 25: p type well layer, 26: p type collector layer, 27: p type power-feed layer, 28: n type emitter layer, 29: gate insulating film (gate oxide film), 30: power loss of double gate IGBT of present invention, 31: power loss of conventional double gate IGBT, 33: low on-voltage IGBT, 34: high on-voltage IGBT, 35: gate of low on-voltage IGBT 33, 36: gate of high on-voltage IGBT 34, 38: control circuit of gate, 40: emitter electrode, 41: collector electrode, 42: carrier control gate (Gc), 44: gate driver, 45: gate driver, 46: high conduction term, 47: low conduction term, 48: conduction term, 49: non-conduction term, 50: turn-off switching, 51: electron carriers, 52: hole carriers, 53: high-concentration accumulated carriers, 54: low-concentration accumulated carriers, 55: ultralow concentration accumulated carrier, 56: concentration reduction of accumulated carriers, 57: turn-off switching waveform of conventional double gate IGBT, 58: turn-off switching waveform of double gate IGBT of present invention, 59: thermal diffusion (by common drift layer, 60: field relaxing region, 61: pad electrode (of carrier control gate (Gc)), 62: pad electrode (of switching gate (Gs)), 63: carrier lifetime killer layer, 64: region where carrier lifetime killer layer is placed, 65: irradiation with light ions, 66: mask (used for irradiation with light ions), 67: thickness of mask covering low conduction region, 68: high-concentration p type collector layer in a high conduction region, 69: low-concentration p type collector layer in a low conduction region, 70: region where high-concentration p type collector layer is placed, 71: diode region, 72: anode power-feed region, 73: anode well region, 74: n type cathode layer, 76: carrier control gate (Gc) having side gate shape, 77: switching gate (Gs) having side gate shape, 78: thick oxide film, 79: double gate IGBT chip, 80: diode chip, 81: insulated substrate, 82: conductive film, 83: terminal conductive to conductive film 82, 84: terminal conductive to emitter electrode of IGBT and anode electrode of diode, 85: double gate IGBT chip of Modification Examples 1 and 2 of Embodiment 5, 86: carrier lifetime killer layer, 87: mask (for irradiation with light ions), 88: thickness of mask that covers switching gate (Gs) region of low conduction region, 91: insulated gate electrode (Gs), 92: insulated gate electrode (Gc), 93: control circuit, 94: drive circuit, 95: inductive load, 96: DC power supply, 97: IGBT, 98: insulated gate terminal, 99: diode, 100: semiconductor device (double gate IGBT), 200: semiconductor device (double gate IGBT), 300: semiconductor device (double gate IGBT), 400: semiconductor device (double gate IGBT), 500, 501: semiconductor device (double gate IGBT), 600: semiconductor device (double gate IGBT), A: small thermal resistance between regions due to common drift region, IT: inner temperature

The invention claimed is:

1. A semiconductor device having a high conduction region and a low conduction region in one semiconductor chip, comprising:

in the low conduction region, a first carrier control gate connected to a first gate electrode, and a switching gate connected to a second gate electrode controllable independently of the first gate electrode; and in the high conduction region, a second carrier control gate connected to a third gate electrode, wherein of the first carrier control gate and the switching gate, the first carrier control gate is placed at an end portion of the low conduction region on a boundary side with the high conduction region, and a concentration of carriers that can be accumulated at conduction time is lower in the low conduction region than in the high conduction region.

2. The semiconductor device according to claim 1, wherein the high conduction region and the low conduction region are directly adjacent to each other.

3. The semiconductor device according to claim 1, comprising:

a first well region adjacent to the second carrier control gate via an insulating film and connected to an emitter electrode; and a second well region adjacent to the first carrier control gate and the switching gate via an insulating film and connected to the emitter electrode, the semiconductor device having:

a first state where a voltage at which an inversion layer is formed in the first well region and the second well region is applied to the first gate electrode, the second gate electrode, and the third gate electrode;

a second state where a voltage at which no inversion layer is formed in the second well region adjacent to the first carrier control gate and in the first well region adjacent to the second carrier control gate is applied to the first gate electrode and the third gate electrode, and a voltage at which an inversion layer is formed in the second well region adjacent to the switching gate is applied to the second gate electrode; and a third state where a voltage at which no inversion layer is formed in the first well region and the second well region is applied to the first gate electrode, the second gate electrode, and the third gate electrode, wherein during transition from a conduction state to a non-conduction state, the transition is performed in the following order: the first state, the second state, and the third state.

4. The semiconductor device according to claim 3, comprising a plurality of the first well regions and a plurality of the second well regions, wherein a distance between the first well regions is wider than a distance between the second well regions.

5. The semiconductor device according to claim 1, wherein the high conduction region and the low conduction region are placed in a common drift layer, and the drift layer in the low conduction region has a carrier lifetime killer layer.

6. The semiconductor device according to claim 5, wherein the drift layer in a region of the low conduction region where the switching gate is placed has another carrier lifetime killer layer different from the aforesaid one.

7. A method of manufacturing the semiconductor device according to claim 6, comprising:

a first irradiation step of placing, on a back surface side of the one semiconductor chip, a first mask having a thickness smaller in a region facing the low conduction region than in a region facing the high conduction region, and irradiating the first mask with light ions from a side opposite to a surface of the first mask facing the one semiconductor chip; and a second irradiation step of placing, on the back surface side of the one semiconductor chip, a second mask having a thickness smaller in a region facing a region of the low conduction region where the switching gate is placed than in the other region, and irradiating the second mask with light ions from a side opposite to a surface of the second mask facing the one semiconductor chip.

8. A method of manufacturing the semiconductor device according to claim 5, comprising:

placing, on a back surface side of the one semiconductor chip, a mask having a thickness of a region facing the low conduction region smaller than a thickness of a region facing the high conduction region; and irradiating the mask with light ions from a side opposite to a surface thereof facing the one semiconductor chip.

9. The semiconductor device according to claim 1, wherein the high conduction region and the low conduction region are placed in a common drift layer, the drift layer has therebelow a carrier injection layer adjacent to the collector electrode, and a concentration of the carrier injection layer in a lower portion of the high conduction region is higher than that of a carrier injection layer in a lower portion of the low conduction region.

10. The semiconductor device according to claim 1, comprising:

a plurality of the high conduction regions and a plurality of the low conduction regions in the one semiconductor chip, and a common field relaxing region at a periphery of the one semiconductor chip, wherein the plurality of the high conduction regions and the plurality of the low conduction regions are surrounded by the common field relaxing region.

11. The semiconductor device according to claim 1, comprising, in the one semiconductor chip, a diode region placed at a boundary between the high conduction region and the low conduction region.

12. The semiconductor device according to claim 1, wherein in the low conduction region, a concentration of carriers which can be accumulated at conduction time in a region having the switching gate therein is lower than a concentration of carriers which can accumulated at conduction time in a region having the first carrier control gate therein.

13. The semiconductor device according to claim 1, wherein the first gate electrode, the second gate electrode, and the third gate electrode each have a trench shape embedded in an insulating film.

14. The semiconductor device according to claim 1, wherein the first gate electrode, the second gate electrode, and the third gate electrode each have a side gate shape having one surface in contact with a well region via an insulating film and the other surface in contact with an insulating film without having a well region and a drift layer.

15. A power conversion device, comprising thereon the semiconductor device according to claim 1.

* * * * *